United States Patent
Kim et al.

(10) Patent No.: US 11,404,252 B2
(45) Date of Patent: Aug. 2, 2022

(54) ELECTROSTATIC CHUCK AND SUBSTRATE PROCESSING APPARATUS INCLUDING THE SAME

(71) Applicant: SAMSUNG ELECTRONICS CO., LTD., Suwon-si (KR)

(72) Inventors: Byeongsang Kim, Hwaseong-si (KR); Keonwoo Kim, Yongin-si (KR); Eungsu Kim, Seoul (KR); Hakyoung Kim, Bucheon-si (KR); Heewon Min, Daejeon (KR); Kyeongtea Bang, Hwaseong-si (KR); Seungwon Shin, Seoul (KR); Dongyun Yeo, Seoul (KR); Hyanjung Lee, Hwaseong-si (KR); Kyeongseok Jeong, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 77 days.

(21) Appl. No.: 16/865,493

(22) Filed: May 4, 2020

(65) Prior Publication Data

US 2021/0111007 A1 Apr. 15, 2021

(30) Foreign Application Priority Data

Oct. 10, 2019 (KR) .................. 10-2019-0125677

(51) Int. Cl.
*H01J 37/32* (2006.01)
*H01L 21/683* (2006.01)
*H01L 21/67* (2006.01)

(52) U.S. Cl.
CPC .. *H01J 37/32807* (2013.01); *H01J 37/32642* (2013.01); *H01J 37/32715* (2013.01);
(Continued)

(58) Field of Classification Search
None
See application file for complete search history.

(56) References Cited

U.S. PATENT DOCUMENTS 8,469,368 B2 6/2013 Kenworthy et al.
9,870,917 B2 1/2018 Kang et al.
(Continued)

FOREIGN PATENT DOCUMENTS

KR 10-0549065 B1 2/2006
KR 10-1044009 B1 6/2011
(Continued)

*Primary Examiner* — Ram N Kackar
*Assistant Examiner* — Laureen Chan
(74) *Attorney, Agent, or Firm* — Sughrue Mion, PLLC

(57) ABSTRACT

An electrostatic chuck includes a chuck plate configured to mount a substrate, an insulation pillar provided outside the chuck plate, the insulation pillar having a pin hole formed therein, a first movable ring provided on the insulation pillar, surrounding a side of the chuck plate, a second movable ring configured to cover at least a part of an upper portion of the first movable ring, and a driving pin configured to move in the pin hole of the insulation pillar in a vertical direction, the driving pin overlapped by at least a part of the first movable ring and at least a part of the second movable ring in the vertical direction. The driving pin is configured to drive the first movable ring and the second movable ring in the vertical direction or to drive the second movable ring in the vertical direction.

11 Claims, 18 Drawing Sheets

(52) U.S. Cl.
CPC .... *H01L 21/67069* (2013.01); *H01L 21/6833* (2013.01); *H01J 2237/334* (2013.01)

(56) References Cited

U.S. PATENT DOCUMENTS

| | | | |
|---|---|---|---|
| 2016/0211166 A1* | 7/2016 | Yan | H01J 37/32642 |
| 2017/0213758 A1* | 7/2017 | Rice | H01L 21/67017 |
| 2018/0166259 A1 | 6/2018 | Ueda | |
| 2018/0277416 A1 | 9/2018 | Takahashi et al. | |
| 2019/0326092 A1* | 10/2019 | Ogasawara | H01J 37/32458 |
| 2020/0219753 A1* | 7/2020 | Uchida | H01L 21/68742 |
| 2020/0234981 A1* | 7/2020 | Schmid | H01L 21/67063 |
| 2020/0312633 A1* | 10/2020 | Rathnasinghe | H01L 21/6835 |
| 2020/0395195 A1* | 12/2020 | Sanchez | H01L 21/68742 |
| 2021/0066052 A1* | 3/2021 | Emura | H01J 37/32715 |
| 2021/0098238 A1* | 4/2021 | Hayashi | H01J 37/32449 |

FOREIGN PATENT DOCUMENTS

| | | | | |
|---|---|---|---|---|
| KR | 10-2012-0122858 A | 11/2012 | | |
| KR | 10-1573962 B1 | 12/2015 | | |
| KR | 10-2017-0074773 A | 6/2017 | | |
| WO | WO-2020231611 A1 * | 11/2020 | | H01J 37/32733 |

* cited by examiner

ELECTROSTATIC CHUCK AND SUBSTRATE PROCESSING APPARATUS INCLUDING THE SAME

CROSS-REFERENCE TO RELATED APPLICATION

This application claims the benefit of Korean Patent Application No. 10-2019-0125677, filed on Oct. 10, 2019, in the Korean Intellectual Property Office, the disclosure of which is incorporated herein in its entirety by reference.

BACKGROUND

The present disclosure relates to an electrostatic chuck and a substrate processing apparatus including the same, and more particularly, to an electrostatic chuck capable of driving a plurality of movable rings in a vertical direction and a substrate processing apparatus including the same.

An electrostatic chuck may include a ring surrounding a substrate and the ring may determine a shape of plasma formed in a chamber of a substrate processing apparatus. The ring may be etched by a physical or chemical reaction in a substrate processing process, which may cause a change in shape of plasma in the substrate processing process.

A worker may open the chamber and may exchange the etched ring into a new ring. When the worker opens the chamber, an environment in the chamber may change. Therefore, yield of the substrate processing process may deteriorate.

SUMMARY

Non-limiting example embodiments of the present disclosure provide an electrostatic chuck capable of preventing a chuck plate from being damaged by plasma and controlling a shape of plasma in a substrate processing process and a substrate processing apparatus including the same.

Non-limiting example embodiments of the present disclosure provide an electrostatic chuck capable of exchanging a movable ring without opening a chamber and a substrate processing apparatus including the same.

Non-limiting example embodiments of the present disclosure provide an electrostatic chuck capable of selectively driving a plurality of movable rings and a substrate processing apparatus including the same.

According to an aspect of non-limiting example embodiments of the present disclosure, there is provided an electrostatic chuck, including a chuck plate configured to mount a substrate, an insulation pillar provided outside the chuck plate, the insulation pillar having a pin hole formed therein, a first movable ring provided on the insulation pillar, surrounding a side of the chuck plate, a second movable ring configured to cover at least a part of an upper portion of the first movable ring, and a driving pin configured to move in the pin hole of the insulation pillar in a vertical direction, the driving pin overlapped by at least a part of the first movable ring and at least a part of the second movable ring in the vertical direction. The driving pin is configured to drive the first movable ring and the second movable ring in the vertical direction or to drive the second movable ring in the vertical direction.

According to an aspect of non-limiting example embodiments of the present disclosure, there is provided an electrostatic chuck, including a chuck plate including a first portion on which the substrate is mounted and a second portion extending from a lower portion of the first portion to outside the first portion, an insulation pillar provided outside the chuck plate and having a pin hole, a first movable ring provided on the insulation pillar, surrounding a side of the first portion of the chuck plate and an upper surface of the second portion of the chuck plate, a second movable ring covering a part of an upper portion of the first movable ring, and a driving pin configured to drive the first movable ring and the second movable ring in a vertical direction and including a pin shaft extending from the pin hole in the vertical direction so as to be overlapped by at least a part of the second movable ring in the vertical direction and a pin protrusion protruding from the pin shaft in a horizontal direction so as to be overlapped by at least a part of the first movable ring in the vertical direction.

According to an aspect of non-limiting example embodiments of the present disclosure, there is provided a substrate processing apparatus, including a process chamber configured to regulate an internal space for processing a substrate, a gas supply connected to the process chamber and configured to supply a treatment gas for processing the substrate in the internal space, a plasma generating unit configured to generate plasma in the internal space, and an electrostatic chuck configured to support the substrate in the internal space. The electrostatic chuck includes a chuck plate configured to mount the substrate, an insulation pillar provided outside the chuck plate, the insulation pillar having a pin hole formed therein, a first movable ring provided on the insulation pillar, surrounding a side of the chuck plate, a second movable ring covering at least a part of an upper portion of the first movable ring, and a driving pin configured to move in the pin hole of the insulation pillar in a vertical direction, the driving pin overlapped by at least a part of the first movable ring and at least a part of the second movable ring in the vertical direction, and configured to drive the first movable ring and the second movable ring in the vertical direction or to drive the second movable ring in the vertical direction.

BRIEF DESCRIPTION OF THE DRAWINGS

Embodiments of the present disclosure will be more clearly understood from the following detailed description taken in conjunction with the accompanying drawings in which.

DETAILED DESCRIPTION OF THE EMBODIMENTS

Hereinafter, embodiments of the present disclosure will be described in detail with reference to the accompanying drawings.

Figure 1:
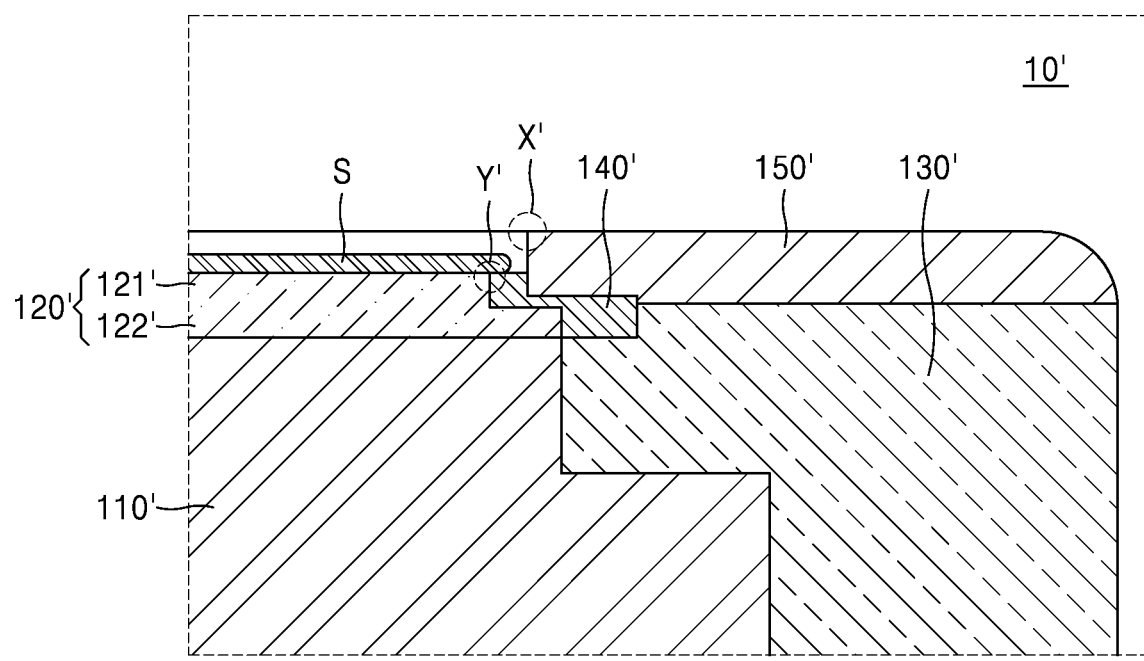
FIG. 1 is a cross-sectional view illustrating enlargement of a side of an electrostatic chuck according to a comparative example.

FIG. 1 is a cross-sectional view illustrating enlargement of a side of an electrostatic chuck 10' according to a comparative example.

Referring to FIG. 1, the electrostatic chuck 10' according to the comparative example may include a body 110', a chuck plate 120', an insulation pillar 130', a first ring 140', and a second ring 150'. The electrostatic chuck 10' may be for settling a substrate S on the chuck plate 120' by electrostatic force.

The chuck plate 120' may be provided on the body 110' and may be a plate on which the substrate S is mounted. For example, the substrate S mounted on the chuck plate 120' may be a wafer on which semiconductor devices are formed. The chuck plate 120' may include a first portion 121' on which the substrate S is mounted and a second portion 122' extending from under the first portion 121' to the outside of the first portion 121'.

The insulation pillar 130' may surround the body 110'. In more detail, the insulation pillar 130' may include an insulating material surrounding the body 110'.

The first ring 140' may prevent the chuck plate 120' from being damaged. The first ring 140' may be mounted on the insulation pillar 130' and may surround a side of the chuck plate 120'. In more detail, the first ring 140' may be mounted on the insulation pillar 130' and may surround a side of the first portion 121' of the chuck plate 120' and an upper surface of the second portion 122'. Since the first ring 140' may surround the side of the chuck plate 120', in a substrate processing process, probability of the chuck plate 120' being damaged by plasma may be reduced.

The second ring 150' may be mounted on the insulation pillar 130' and may cover an upper portion of the insulation pillar 130' and a part of an upper portion of the first ring 140'. A shape of the second ring 150' may affect that of plasma formed in the substrate processing process. For example, when the second ring 150' is etched and a shape thereof changes, the shape of plasma formed in the substrate processing process may also change.

When the electrostatic chuck 10' according to the comparative example is repeatedly used, a portion Y' adjacent to the substrate S of the first ring 140' may be etched by plasma. The etched first ring 140' may expose the side of the chuck plate 120'. Therefore, the side of the chuck plate 120' may be damaged by plasma in the substrate processing process.

In addition, when the electrostatic chuck 10' is repeatedly used, a portion X' adjacent to the substrate S of the second ring 150' may be also etched by plasma. The etched first ring 140' may change the shape of plasma in the substrate processing process.

Therefore, it is necessary to periodically exchange the etched first and second rings 140' and 150'. In order to exchange the etched first and second rings 140' and 150', a worker must open a chamber in which the electrostatic chuck 10' is positioned. When the worker opens the chamber, due to a change in environment in the chamber, yield of the substrate processing process may deteriorate.

Figure 2:
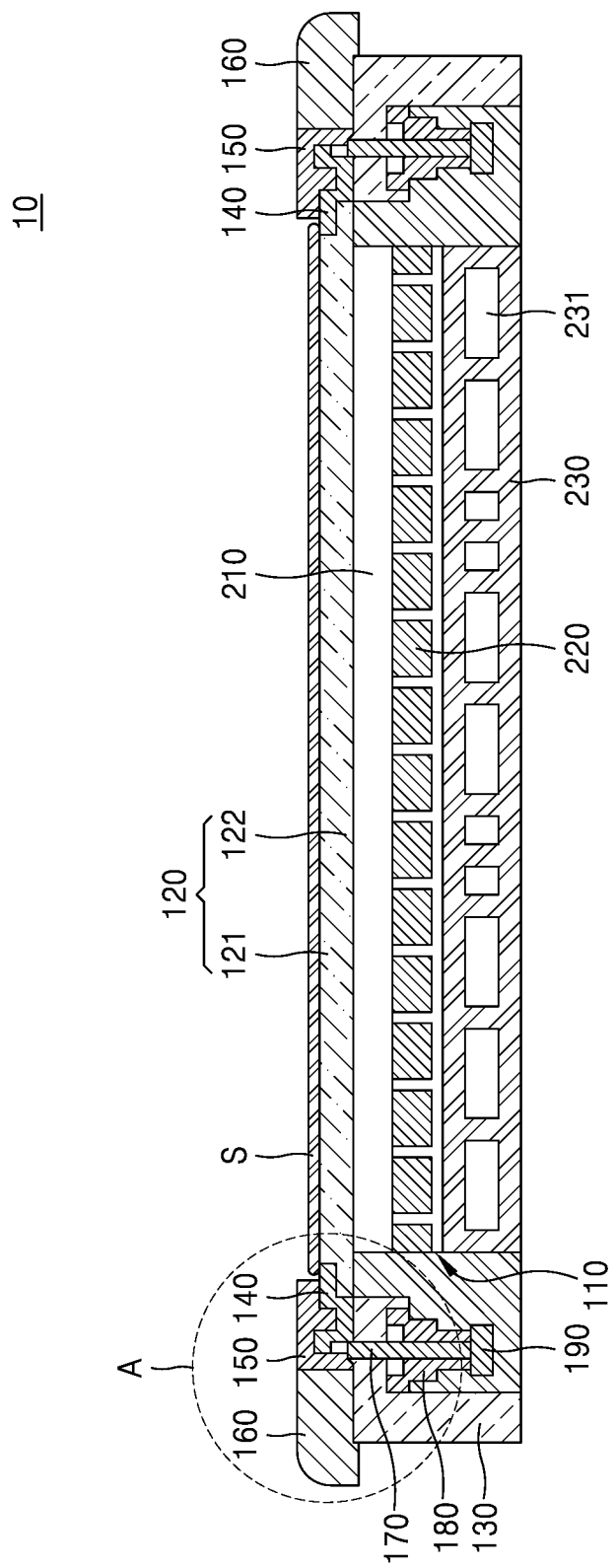
FIG. 2 is a cross-sectional view of an electrostatic chuck according to an embodiment of the present disclosure.

FIG. 2 is a cross-sectional view of an electrostatic chuck 10 according to a non-limiting example embodiment of the present disclosure.

Referring to FIG. 2, the electrostatic chuck 10 according to the embodiment of the present disclosure may include a body 110, a chuck plate 120, an insulation pillar 130, a first movable ring 140, a second movable ring 150, a fixed ring 160, a driving pin 170, a guide holder 180, and a power source 190. In addition, the electrostatic chuck 10 may further include an electrostatic plate 210, a heating plate 220, and a cooling plate 230.

In a non-limiting example embodiment, the body 110 may be a cylindrical pedestal. The body 110 may accommodate the electrostatic plate 210, the heating plate 220, and the cooling plate 230.

In a non-limiting example embodiment, the chuck plate 120 may be provided in the body 110. On the chuck plate 120, the substrate S may be mounted. In order to secure tolerance against high temperature plasma, the chuck plate 120 may include a non-conductive material less transformed by heat.

The chuck plate 120 may include a first portion 121 on which the substrate S is mounted and a second portion 122 extending from under the first portion 121 to the outside of the first portion 121. When the chuck plate 120 is seen top to bottom, an upper surface of the first portion 121 and a part of an upper surface of the second portion 122 may be exposed.

In a non-limiting example embodiment, the insulation pillar 130 may be provided outside the chuck plate 120. In more detail, the insulation pillar 130 may surround the body 110 outside the chuck plate 120. In addition, the insulation pillar 130 may include an insulating material.

In the insulation pillar 130, a pin hole H1 (refer to FIG. 3) may be formed. The pin hole H1 may provide a space in which a driving pin 170 (refer to FIG. 3) to be described later may move in a vertical direction. The pin hole H1 may be overlapped by at least a part of the first movable ring 140 and at least a part of the second movable ring 150 in the vertical direction.

In a non-limiting example embodiment, the first movable ring 140 may surround a side of the chuck plate 120 on the insulation pillar 130. In more detail, the first movable ring 140 may surround a side of the first portion 121 of the chuck plate 120 and the upper surface of the second portion 122 of the chuck plate 120 on the insulation pillar 130. Since the first movable ring 140 may surround the side of the chuck plate 120, in the substrate processing process, probability of the chuck plate 120 being damaged by plasma may be reduced. In addition, when the substrate S is mounted on the chuck plate 120, a part of the first movable ring 140 may overlap a part of an edge of the substrate S in the vertical direction.

The first movable ring 140 may be moved by the driving pin 170 in the vertical direction. In more detail, the driving pin 170 may be provided under the first movable ring 140 and at least a part of the first movable ring 140 may overlap a part of the driving pin 170 in the vertical direction. The first movable ring 140 may be driven by external force transmitted by the driving pin 170 to the first movable ring 140 in the vertical direction.

The first movable ring 140 may be driven in the vertical direction in a state in which the substrate S is not mounted on the chuck plate 120. Since the first movable ring 140 may be driven by the driving pin 170 in the vertical direction, the first movable ring 140 may be exchanged into a new ring by a separate transfer system without opening the chamber. Therefore, when the first movable ring 140 is exchanged, a change in environment in the chamber may be small so that yield of the substrate processing process may improve.

In a non-limiting example embodiment, the second movable ring 150 may cover a part of an upper portion of the first movable ring 140. The second movable ring 150 may prevent the first movable ring 140 from being etched by plasma in the substrate processing process.

The second movable ring 150 may affect the shape of plasma formed in the substrate processing process. For example, when a shape of the second movable ring 150 or a distance between the second movable ring 150 and the insulation pillar 130 in the vertical direction changes, the shape of plasma formed in the substrate processing process may also change. The second movable ring 150 may be referred to as a focus ring. In addition, the second movable ring 150 may include a material such as quartz, silicon carbide, silicon oxide, or aluminum (Al) oxide.

The second movable ring 150 may be moved by the driving pin 170 in the vertical direction. In more detail, the driving pin 170 may be provided under the second movable ring 150 and at least a part of the second movable ring 150 may overlap a part of the driving pin 170 in the vertical direction. The second movable ring 150 may be driven by external force transmitted by the driving pin 170 to the second movable ring 150 in the vertical direction.

The second movable ring 150 may be driven in the vertical direction in a state in which the substrate S is mounted on the chuck plate 120. The second movable ring 150 may be driven in the vertical direction in a process in which the substrate S is processed. The distance between the second movable ring 150 and the insulation pillar 130 in the vertical direction may be controlled by the driving pin 170. Therefore, the shape of plasma formed in the substrate processing process may be also controlled by the driving pin 170. For example, due to repetition of the substrate processing process, when a part of the second movable ring 150 is etched so that, the shape of plasma is different from a predicted shape, the second movable ring 150 may be driven by the driving pin 170 in the vertical direction. Therefore, in the substrate processing process, plasma may have the predicted shape.

Since the second movable ring 150 may be driven by the driving pin 170 in the vertical direction, the second movable ring 150 may be exchanged into a new ring by a separate transfer system without opening the chamber. Therefore, when the second movable ring 150 is exchanged, a change in environment in the chamber may be small so that yield of the substrate processing process may improve.

In a non-limiting example embodiment, the fixed ring 160 may cover a part of an upper surface of the insulation pillar 130 so as to surround the first movable ring 140 and the second movable ring 150. The fixed ring 160 may be provided outside the pin hole H1 of the insulation pillar 130 and may not overlap the driving pin 170 in the vertical direction. Therefore, the fixed ring 160 may not be interfered by movement of the driving pin 170 in the vertical direction.

In a non-limiting example embodiment, the driving pin 170 may move in the pin hole H1 of the insulation pillar 130 in the vertical direction. In more detail, the driving pin 170 moves in the pin hole H1 of the insulation pillar 130 in the vertical direction and may drive the first movable ring 140 and the second movable ring 150 in the vertical direction.

The driving pin 170 may include a rod-shaped pin extending in the pin hole H1 in the vertical direction. The driving pin 170 may be plural. The plurality of driving pins 170 may be symmetrical with each other based on the center of the chuck plate 120. For example, the number of driving pins 170 may be three and the three driving pins 170 may be symmetrical with each other based on the center of the chuck plate 120.

The driving pin 170 may be overlapped by at least a part of the first movable ring 140 and at least a part of the second movable ring 150 in the vertical direction. Therefore, the driving pin 170 may drive the first movable ring 140 and the second movable ring 150 in the vertical direction.

The driving pin 170 may be in one of a first state, a second state, and a third state. In the first state of the driving pin 170, the driving pin 170 does not drive the first movable ring 140 and the second movable ring 150 in the vertical direction.

In the second state of the driving pin 170, the driving pin 170 moves and may drive the second movable ring 150 in the vertical direction. As described above, the driving pin 170 may drive the second movable ring 150 in the vertical direction in order to change the shape of plasma formed in the substrate processing process. When the driving pin 170 is in the second state, the second movable ring 150 is driven in the vertical direction and may be spaced apart from the insulation pillar 130 in the vertical direction. When the driving pin 170 is in the second state, the driving pin 170 may not drive the first movable ring 140 in the vertical direction.

In the third state of the driving pin 170, the driving pin 170 moves and may drive the first movable ring 140 and the second movable ring 150 in the vertical direction. As described above, in order to exchange at least one of the first movable ring 140 and the second movable ring 150, the driving pin 170 may drive the first movable ring 140 and the second movable ring 150 in the vertical direction. When the driving pin 170 is in the third state, the driving pin 170 drives the first movable ring 140 and the second movable ring 150 in the vertical direction and may be spaced apart from the insulation pillar 130 in the vertical direction.

In a non-limiting example embodiment, without being limited as illustrated in FIG. 2, the electrostatic chuck 10 according to the embodiment of the present disclosure may include three or more movable rings. In addition, the plurality of movable rings may overlap at least a part of the driving pin 170 in the vertical direction. Therefore, when the driving pin 170 moves in the vertical direction, at least one of the plurality of movable rings may be driven in the vertical direction.

Structures of the first movable ring 140, the second movable ring 150, and the driving pin 170 according to embodiment of the present disclosure and a method of driving the first movable ring 140, the second movable ring 150, and the driving pin 170 according to embodiments of the present disclosure will be described in detail later with reference to FIGS. 3 to 17.

In a non-limiting example embodiment, the guide holder 180 may be for guiding movement of the driving pin 170 in the vertical direction. The guide holder 180 may have a guide hole in which the driving pin 170 is positioned. The guide holder 180 may prevent the driving pin 170 from being inclined. Therefore, the driving pin 170 may move in the vertical direction without being inclined.

In a non-limiting example embodiment, the power source 190 may be for transmitting power to the driving pin 170. In more detail, the power source 190 may be for transmitting power to the driving pin 170 for the movement of the driving pin 170 in the vertical direction. For example, the power source 190 may include a hydraulic system and a motor.

The electrostatic chuck 10 according to the non-limiting example embodiment may further include the electrostatic plate 210, the heating plate 220, and the cooling plate 230.

In a non-limiting example embodiment, the electrostatic plate 210 may generate electrostatic force under the chuck plate 120. The electrostatic plate 210 may be electrically connected to an electrostatic chuck power unit 1530 (refer to FIG. 18) to be described later. By power, for example, a direct current (DC) voltage applied from the electrostatic chuck power unit 1530, electrostatic force may be generated between the electrostatic plate 210 and the substrate S. The substrate S may be firmly mounted on the chuck plate 120 by the electrostatic force.

In a non-limiting example embodiment, the heating plate 220 may emit heat in order to heat the substrate S on the chuck plate 120. The heating plate 220 may be electrically connected to a heater power unit 1540 (refer to FIG. 18) to be described later. The heating plate 220 may include a plurality of heating elements. For example, the heating plate 220 may include at least one of a thermoelectric element, a resistance heater, and an inductance heater. The plurality of heating elements may be individually controlled in order to control a local temperature of the substrate S on the chuck plate 120.

In a non-limiting example embodiment, the cooling plate 230 may cool the substrate S on the chuck plate 120 or a plurality of electronic apparatuses included in the electrostatic chuck 10. The cooling plate 230 may be electrically connected to a thermostat 1570 (refer to FIG. 18) to be described later. The cooling plate 230 may include a cooling water channel 231 through which at least one of water, ethylene, glycol, and silicon oil flows.

Figure 3:
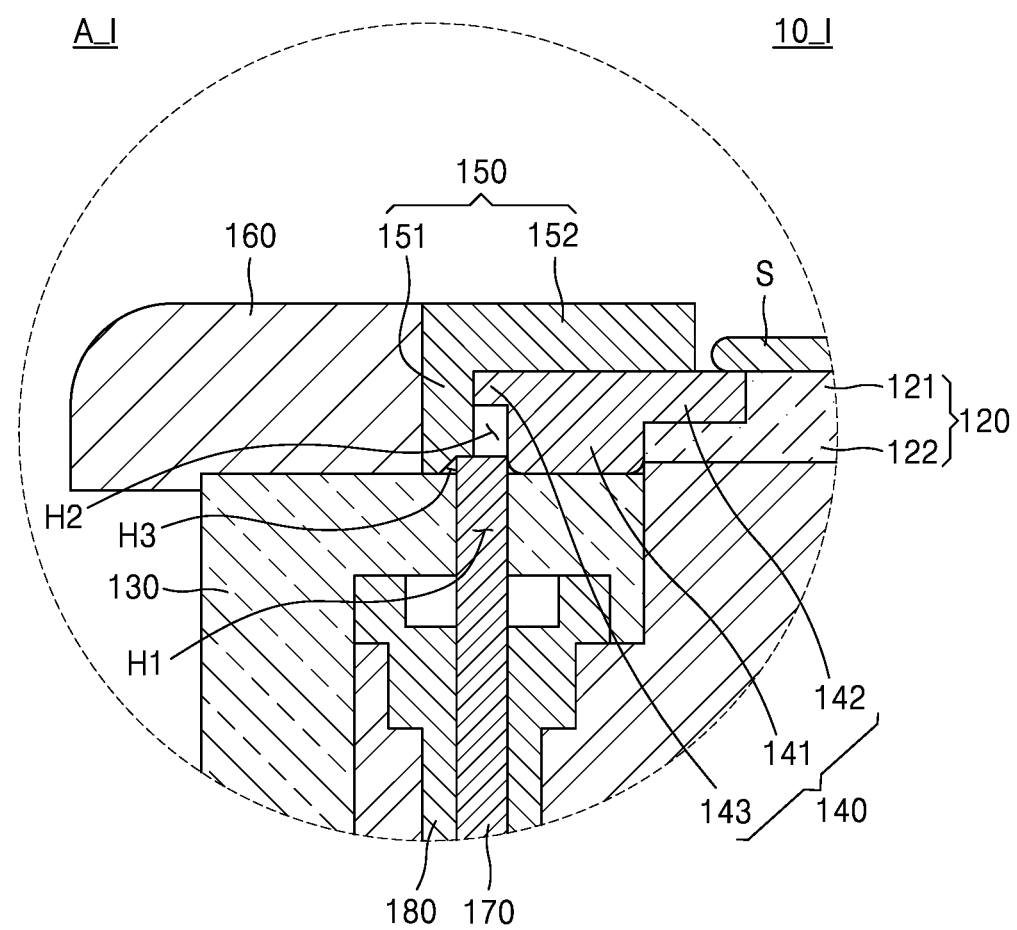
FIG. 3 is a cross-sectional view illustrating enlargement of a side of an electrostatic chuck in a first state.
Figure 4:
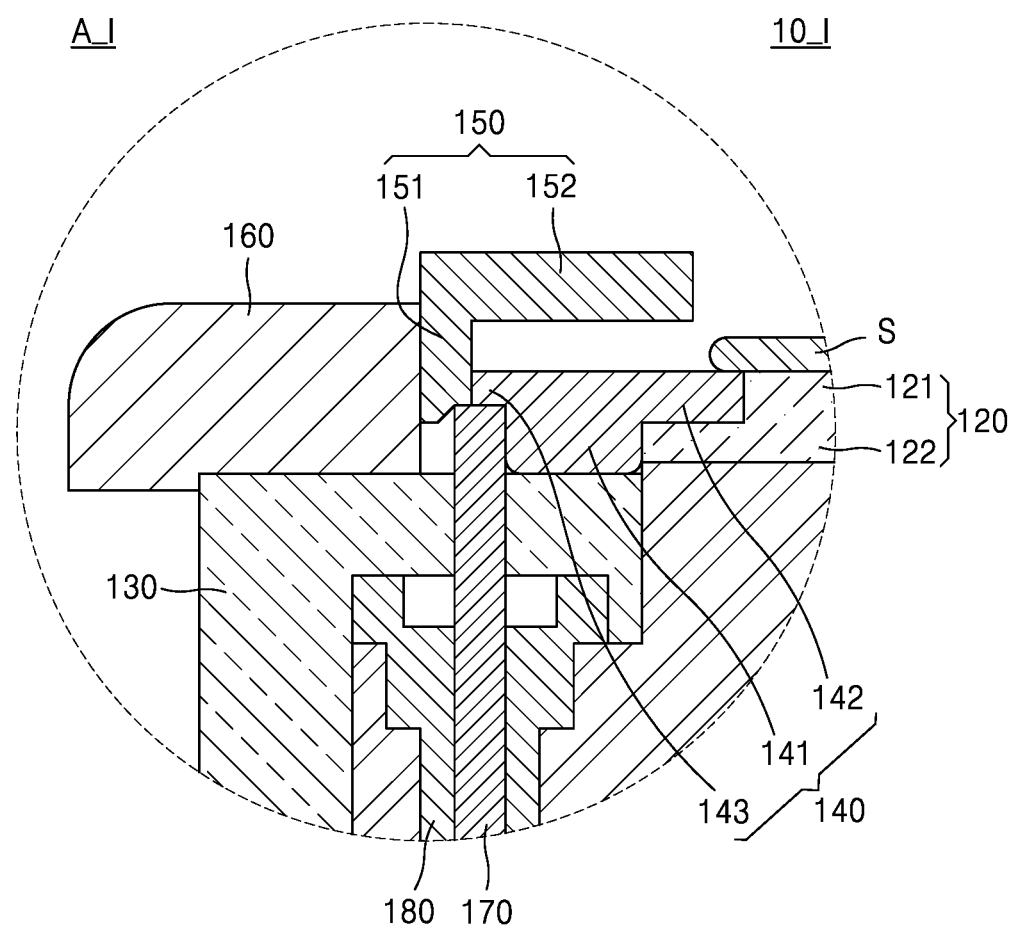
FIG. 4 is a cross-sectional view illustrating enlargement of a side of an electrostatic chuck in a second state.
Figure 5:
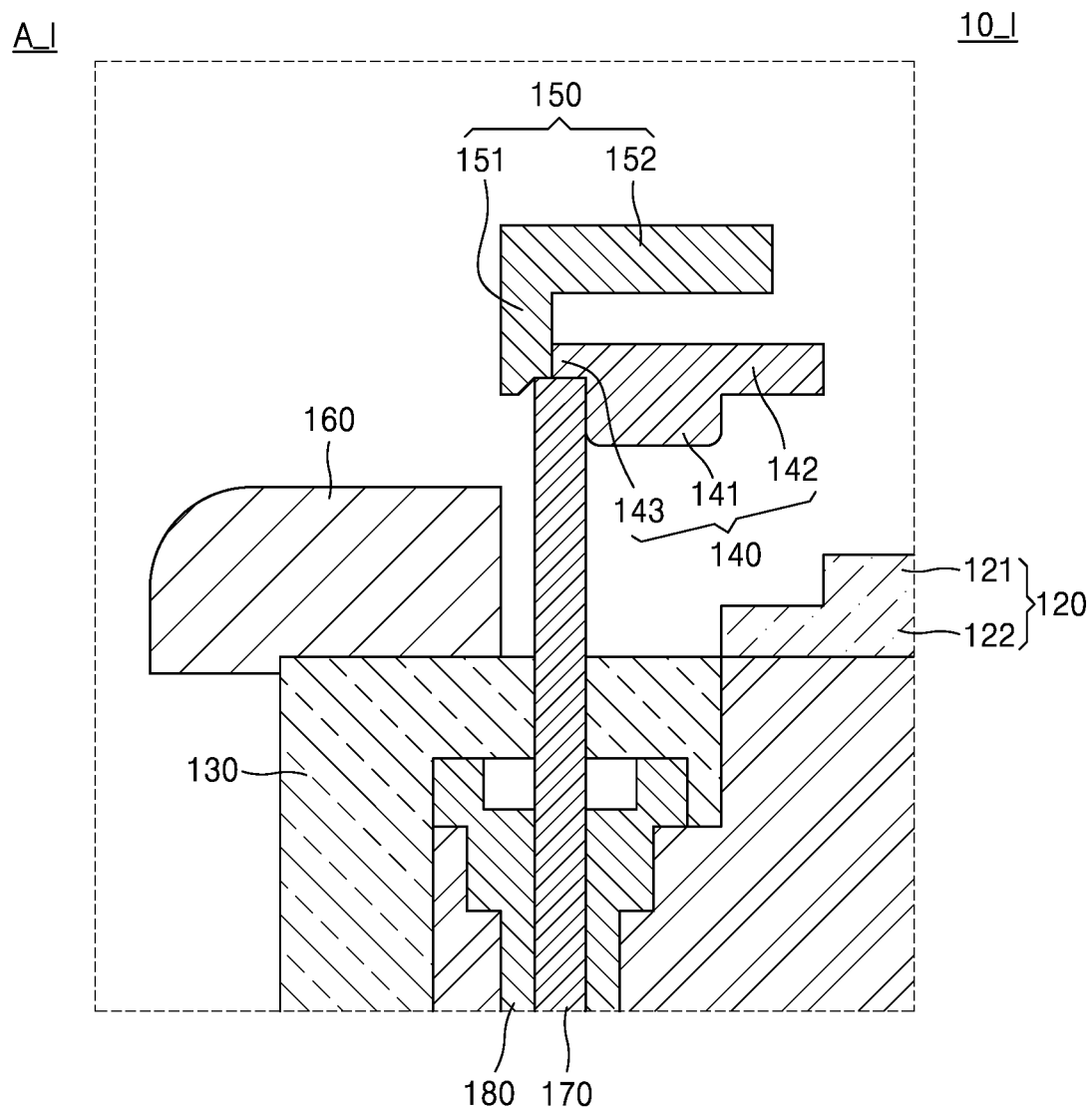
FIG. 5 is a cross-sectional view illustrating enlargement of a side of an electrostatic chuck in a third state.

FIGS. 3 to 5 are cross-sectional views illustrating enlargement of a side A_I of an electrostatic chuck 10_I according to a non-limiting example embodiment of the present disclosure. In more detail, FIG. 3 is a cross-sectional view illustrating the enlargement of the side A_I of the electrostatic chuck 10_I in a first state. In the first state of the electrostatic chuck 10_I, the driving pin 170 may not operate. That is, in the first state of the electrostatic chuck 10_I, the first movable ring 140 and the second movable ring 150 may not be driven in the vertical direction.

Referring to FIG. 3, the first movable ring 140 may include a support unit 141, a protection unit 142, and a first contact unit 143. In a non-limiting example embodiment, the support unit 141 may be a part of the first movable ring 140 mounted on the insulation pillar 130. In the first state of the electrostatic chuck 10_I, the support unit 141 may contact the insulation pillar 130.

In a non-limiting example embodiment, the protection unit 142 may be a part of the first movable ring 140 extending from inside the support unit 141 in a horizontal direction and surrounding the side of the chuck plate 120. In more detail, the protection unit 142 may extend from inside the support unit 141 in the horizontal direction and may surround the side of the first portion 121 of the chuck plate 120 and the upper surface of the second portion 122 of the chuck plate 120. In the first state of the electrostatic chuck 10_I, the protection unit 142 may contact the side of the chuck plate 120.

In a non-limiting example embodiment, the first contact unit 143 may be a part of the first movable ring 140 extending from outside the support unit 141 in the horizontal direction. In the first contact unit 143, a first driving groove H2 may be formed. The first driving groove H2 may provide a space in which the above-described driving pin 170 is positioned and may move in the vertical direction. The first driving groove H2 may overlap a part of the driving pin 170 in the vertical direction. In the first state of the electrostatic chuck 10_I, the first contact unit 143 may not contact the driving pin 170.

The movable ring 150 may include a second contact unit 151 and a cover 152. In a non-limiting example embodiment, the second contact unit 151 may be a part of the second movable ring 150 surrounding a side of the first movable ring 140 on the insulation pillar 130. In the first state of the electrostatic chuck 10_I, the second contact unit 151 may contact the insulation pillar 130.

In the second contact unit 151, a second driving groove H3 may be formed. The second driving groove H3 may provide a space in which the above-described driving pin 170 is positioned and may move in the vertical direction. The second driving groove H3 may overlap a part of the driving pin 170 in the vertical direction. In addition, a depth of the second driving groove H3 of the second contact unit 151 may be less than that of the first driving groove H2 of the first contact unit 143.

In a non-limiting example embodiment, the cover 152 may be a part of the second movable ring 150 extending from the second contact unit 151 in the horizontal direction and covering a part of the upper portion of the first movable ring 140. In more detail, the cover 152 may extend from an upper portion of the second contact 151 in the horizontal direction and may cover the first contact unit 143 of the first movable ring 140 and a part of the protection unit 142 of the first movable ring 140.

FIG. 4 is a cross-sectional view illustrating enlargement of the side A_I of the electrostatic chuck 10_I in the second state. In the second state of the electrostatic chuck 10_I, the driving pin 170 may drive the second movable ring 150 in the vertical direction.

Referring to FIG. 4, when the electrostatic chuck 10_I is in the second state, the driving pin 170 may drive the second movable ring 150 in the vertical direction and may not drive the first movable ring 140. In more detail, when the electrostatic chuck 10_I is in the second state, the second movable ring 150 may be spaced apart from the insulation pillar 130 in the vertical direction and the first movable ring 140 may contact the insulation pillar 130.

In a non-limiting example embodiment, in the second state of the electrostatic chuck 10_I, in order to change the shape of plasma formed in the substrate processing process, the second movable ring 150 may be driven in the vertical direction. In addition, when the electrostatic chuck 10_I is in the second state, the substrate S may be mounted on the chuck plate 120.

In a non-limiting example embodiment, the driving pin 170 may be positioned in the second driving groove H3 of the second movable ring 150 and may contact the second contact unit 151. In addition, the driving pin 170 may be positioned in the first driving groove H2 of the first movable ring 140 and may contact the first contact unit 143. Embodiments of the present disclosure are not limited thereto. The driving pin 170 is positioned in the first driving groove H2 of the first movable ring 140 and contact the first contact unit 143 and may not drive the first movable ring 140 in the vertical direction.

In a non-limiting example embodiment, when the driving pin 170 moves with a depth greater than that of the second driving groove H3 and less than that of the first driving groove H2 in the vertical direction, the driving pin 170 may drive only the second movable ring 150 in the vertical direction. When the second movable ring 150 is driven in the vertical direction in a state in which the first movable ring 140 contacts the insulation pillar 130, the distance between the second movable ring 150 and the insulation pillar 130 in the vertical direction may be less than the depth of the first driving groove H2 of the first movable ring 140. For example, the maximum value of the distance between the second movable ring 150 and the insulation pillar 130 in the vertical direction in the state in which the first movable ring 140 contacts the insulation pillar 130 may be equal to a difference between the depth of the first driving groove H2 and the depth of the second driving groove H3.

FIG. 5 is a cross-sectional view illustrating enlargement of the side A_I of the electrostatic chuck 10_I in the third state. In the third state of the electrostatic chuck 10_I, the driving pin 170 may drive the first movable ring 140 and the second movable ring 150 in the vertical direction.

Referring to FIG. 5, when the electrostatic chuck 10_I is in the third state, the driving pin 170 may drive the first movable ring 140 and the second movable ring 150. In more detail, when the electrostatic chuck 10_I is in the third state, the first movable ring 140 and the second movable ring 150 may be spaced apart from the insulation pillar 130 in the vertical direction.

In a non-limiting example embodiment, in the third state of the electrostatic chuck 10_I, in order to exchange at least one of the first movable ring 140 and the second movable ring 150, the first movable ring 140 and the second movable ring 150 may be driven in the vertical direction. In addition, when the electrostatic chuck 10_I is in the third state, the substrate S may not be mounted on the chuck plate 120.

In a non-limiting example embodiment, the driving pin 170 may be positioned in the first driving groove H2 of the first movable ring 140 and may contact the first contact unit 143. In addition, the driving pin 170 may be positioned in the second driving groove H3 of the second movable ring 150 and may contact the second contact unit 151. In the third state of the electrostatic chuck 10_I, a surface of the first contact unit 143 of the first movable ring 140, which contacts the driving pin 170 may be at the same level as that of a surface of the second contact unit 151 of the second movable ring 150, which contacts the driving pin 170.

When the driving pin 170 moves with a depth greater than that of the first driving groove H2 of the first movable ring 140 in the vertical direction, the driving pin 170 may drive the first movable ring 140 and the second movable ring 150 in the vertical direction.

Figure 6:
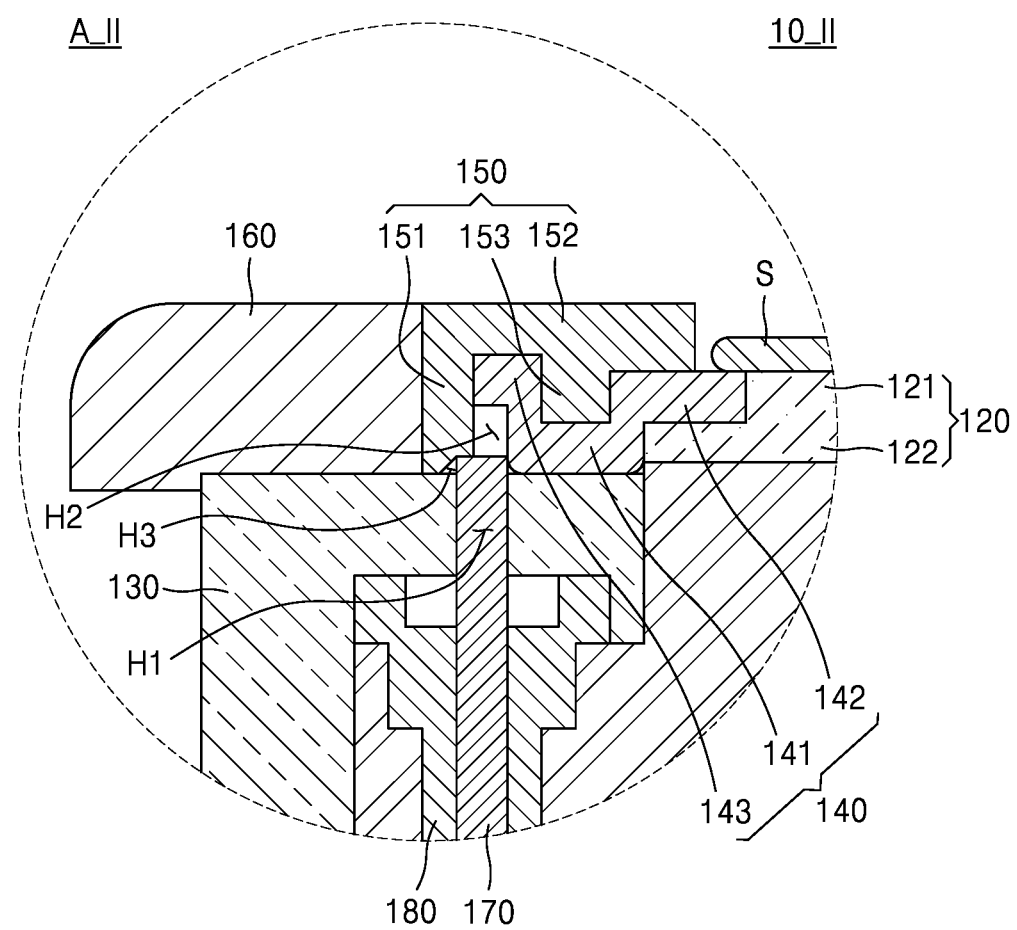
FIG. 6 is a cross-sectional view illustrating enlargement of a side of an electrostatic chuck in a first state.
Figure 7:
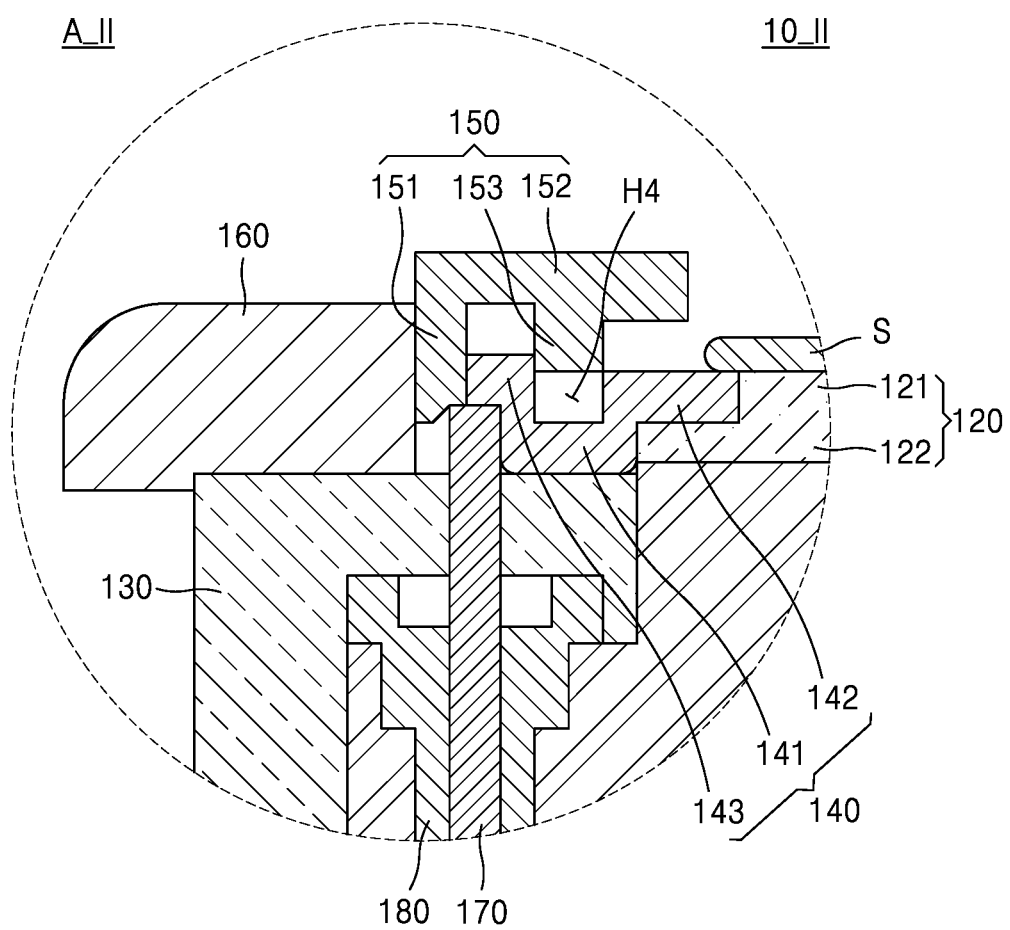
FIG. 7 is a cross-sectional view illustrating enlargement of a side of an electrostatic chuck in a second state.
Figure 8:
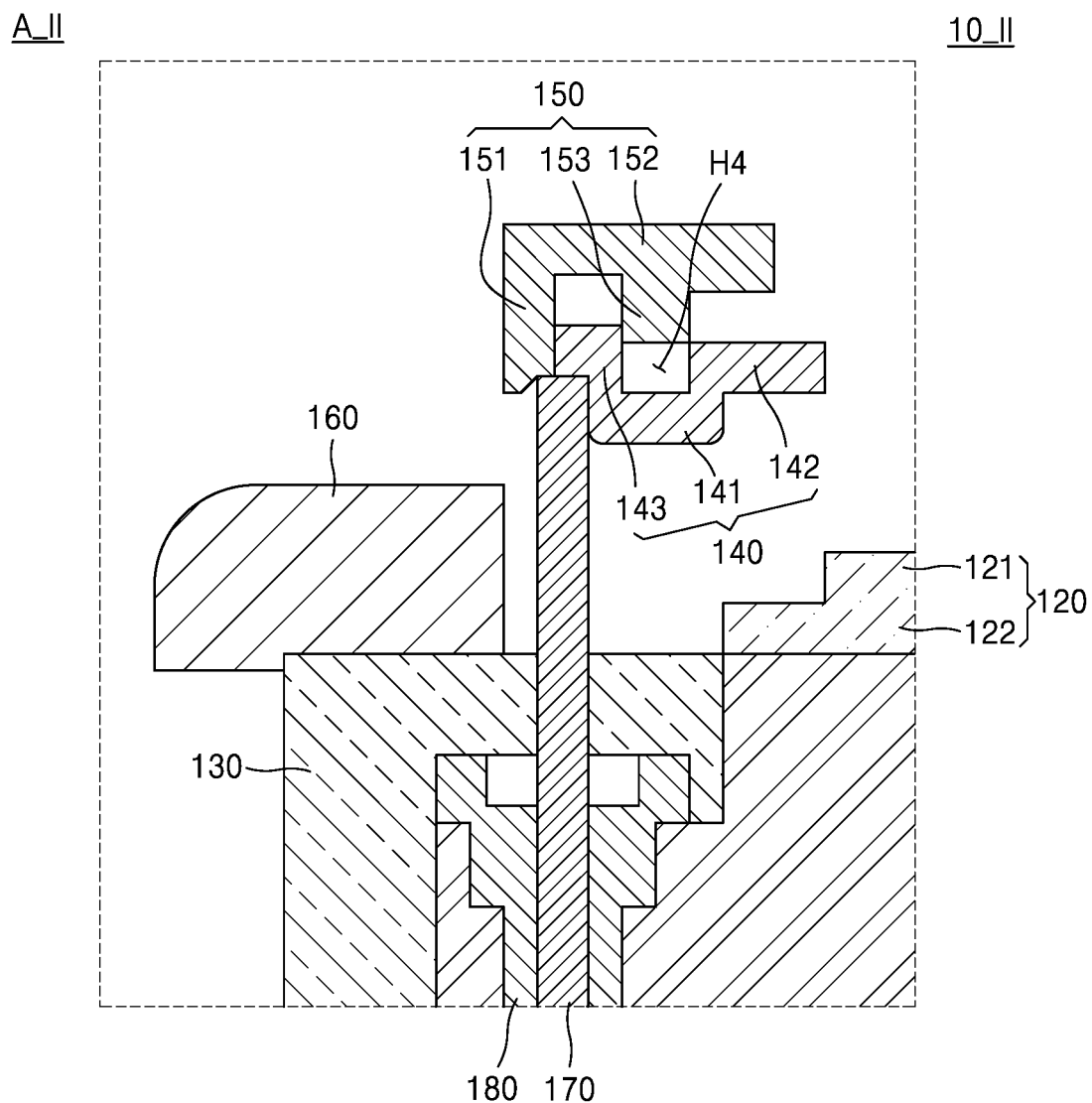
FIG. 8 is a cross-sectional view illustrating enlargement of a side of an electrostatic chuck in a third state.

FIGS. 6 to 8 are cross-sectional views illustrating enlargement of a side A_II of an electrostatic chuck 10_II according to a non-limiting example embodiment of the present disclosure. In more detail, FIG. 6 is a cross-sectional view illustrating the enlargement of the side A_II of the electrostatic chuck 10_II in the first state.

Referring to FIG. 6, the first movable ring 140 may include a support unit 141, a protection unit 142, and a first contact unit 143. Since description of the support unit 141, the protection unit 142, and the first contact unit 143 of the first movable ring 140 is the same as that given with reference to FIGS. 3 to 5, detailed description thereof will not be given. Hereinafter, a difference between the electrostatic chuck 10_II of FIGS. 6 to 8 and the above-described electrostatic chuck 10_I of FIGS. 3 to 5 will be mainly described.

In a non-limiting example embodiment, in the first movable ring 140, a protrusion groove H4 (refer to FIG. 7) may be formed. The protrusion groove H4 may be formed between the protection unit 142 and the first contact unit 143 of the first movable ring 140. The protrusion groove H4 of the first movable ring 140 may provide a space in which a protrusion 153 of the second movable ring 150 to be mentioned later is positioned.

In a non-limiting example embodiment, the second movable ring 150 may include a second contact unit 151, a cover 152, and a protrusion 153. The protrusion 153 may be a part of the second movable ring 150 protruding from the cover 152 downward. The protrusion 153 may be accommodated in the protrusion groove H4 of the first movable ring 140.

FIG. 7 is a cross-sectional view illustrating enlargement of the side A_II of the electrostatic chuck 10_II in the second state. In the second state of the electrostatic chuck 10_II, the driving pin 170 may drive the second movable ring 150 in the vertical direction.

In the second state of the electrostatic chuck 10_II, in order to change the shape of plasma formed in the substrate processing process, the second movable ring 150 may be driven in the vertical direction. In addition, when the electrostatic chuck 10_II is in the second state, the substrate S may be mounted on the chuck plate 120.

Referring to FIG. 7, when the second movable ring 150 is driven in the vertical direction, a protrusion groove H4 formed in the first movable ring 140 may be exposed. As the protrusion groove H4 of the first movable ring 140 is exposed, the shape of plasma formed by the electrostatic chuck 10_II of FIGS. 6 to 8 in the substrate processing process may be different from that of plasma formed by the above-described electrostatic chuck 10_I of FIGS. 3 to 5 in the substrate processing process. That is, in accordance with a kind and condition of the substrate processing process, one of the electrostatic chuck 10_I of FIGS. 3 to 5 and the electrostatic chuck 10_II of FIGS. 6 to 8 may be selected by a worker.

When the electrostatic chuck 10_II is in the second state, the driving pin 170 may drive the second movable ring 150 in the vertical direction and may not drive the first movable ring 140. In more detail, when the electrostatic chuck 10_II is in the second state, the second movable ring 150 may be spaced apart from the insulation pillar 130 in the vertical direction and the first movable ring 140 may contact the insulation pillar 130.

FIG. 8 is a cross-sectional view illustrating enlargement of the side A_II of the electrostatic chuck 10_II in the third state. In the third state of the electrostatic chuck 10_II, the driving pin 170 may drive the first movable ring 140 and the second movable ring 150 in the vertical direction.

Referring to FIG. 8, when the electrostatic chuck 10_II is in the third state, the driving pin 170 may drive the first movable ring 140 and the second movable ring 150. In more detail, when the electrostatic chuck 10_II is in the third state, the first movable ring 140 and the second movable ring 150 may be spaced apart from the insulation pillar 130 in the vertical direction.

In a non-limiting example embodiment, in the third state of the electrostatic chuck 10_II, in order to exchange at least one of the first movable ring 140 and the second movable ring 150, the first movable ring 140 and the second movable ring 150 may be driven in the vertical direction. In addition, when the electrostatic chuck 10_II is in the third state, the substrate S may not be mounted on the chuck plate 120.

Figure 9:
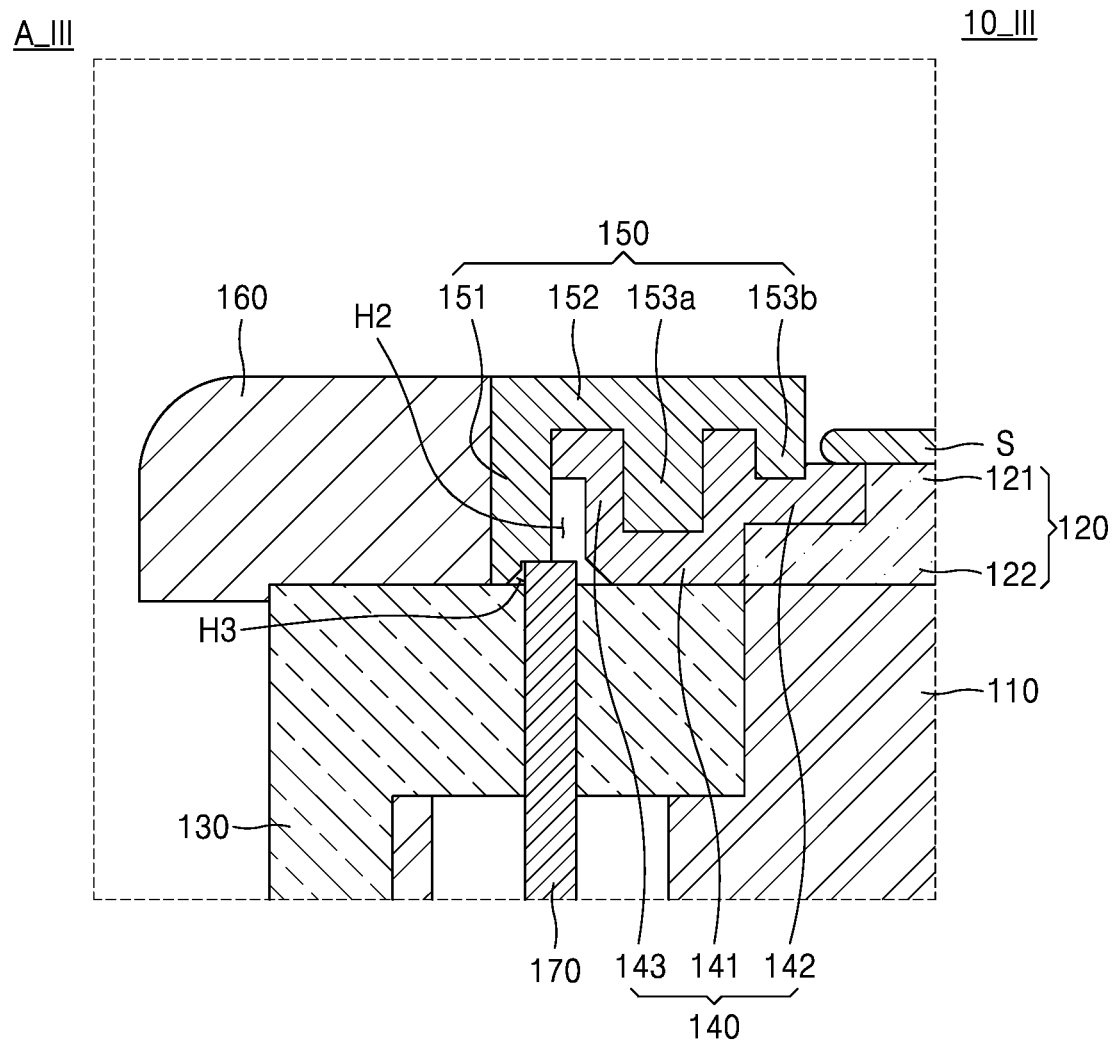
FIG. 9 is a cross-sectional view illustrating enlargement of a side of an electrostatic chuck in a first state.
Figure 10:
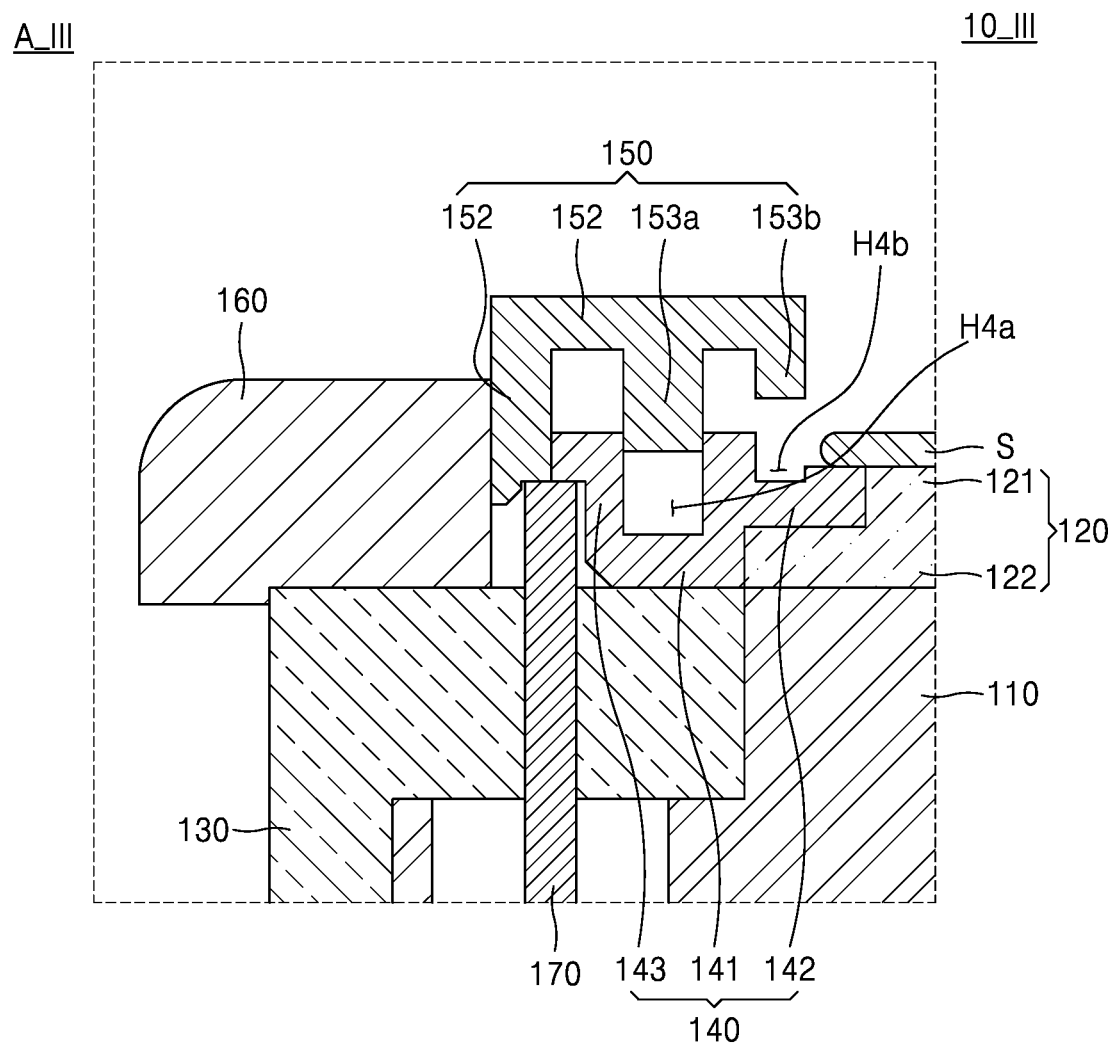
FIG. 10 is a cross-sectional view illustrating enlargement of a side of an electrostatic chuck in a second state.
Figure 11:
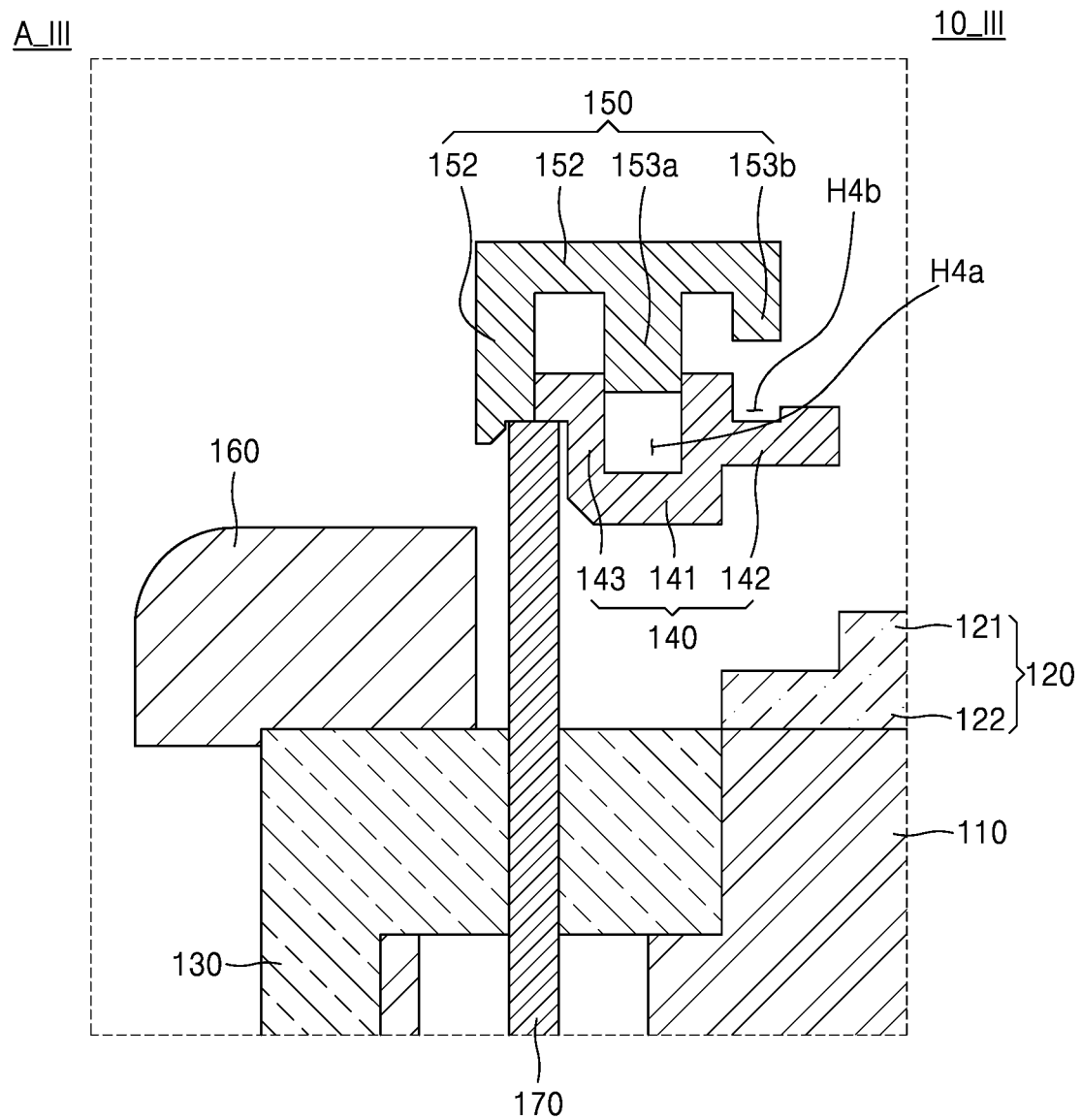
FIG. 11 is a cross-sectional view illustrating enlargement of a side of an electrostatic chuck in a third state.

FIGS. 9 to 11 are cross-sectional views illustrating enlargement of a side A_III of an electrostatic chuck 10_III according to an embodiment of the present disclosure. In more detail, FIG. 9 is a cross-sectional view illustrating the enlargement of the side A_III of the electrostatic chuck 10_III in the first state.

Referring to FIG. 9, the first movable ring 140 may include the support unit 141, the protection unit 142, and the first contact unit 143. In addition, the second movable ring 150 may include the second contact unit 151, the cover 152, a first protrusion 153a, and a second protrusion 153b. Since description of the support unit 141, the protection unit 142, and the first contact unit 143 of the first movable ring 140 is the same as that of the second contact unit 151 and the cover 152 of the second movable ring 150, which is given with reference to FIGS. 3 to 5, detailed description thereof will not be given.

In a non-limiting example embodiment, the second movable ring 150 may include a plurality of protrusions. For example, the second movable ring 150 may include the first protrusion 153a and the second protrusion 153b. The first protrusion 153a may be a part of the second movable ring 150 protruding from the cover 152 downward. The first protrusion 153a may be inserted into a first protrusion groove H4a formed between the first contact unit 143 and the protection unit 142 of the first movable ring 140. In addition, the second protrusion 153b may be a part of the second movable ring 150 protruding from the cover 152 downward so as to be provided inside the first protrusion 153a and the second protrusion 153b may be inserted into a second protrusion groove H4b formed in the protection unit 142 of the first movable ring 140.

When the electrostatic chuck 10_III is in the first state, the first contact unit 143 of the first movable ring 140 may not contact the driving pin 170 and the first movable ring 140 may contact the insulation pillar 130. In addition, the second contact unit 151 of the second movable ring 150 may not contact the driving pin 170 and the second movable ring 150 may contact the insulation pillar 130.

FIG. 10 is a cross-sectional view illustrating the enlargement of the side A_III of the electrostatic chuck 10_III in the second state. In the second state of the electrostatic chuck 10_III, the driving pin 170 may drive the second movable ring 150 in the vertical direction.

Referring to FIG. 10, when the electrostatic chuck 10_III is in the second state, the driving pin 170 may drive the second movable ring 150 in the vertical direction and may not drive the first movable ring 140 in the vertical direction.

In a non-limiting example embodiment, when the driving pin 170 moves with a depth greater than that of the second driving groove H3 and less than that of the first driving groove H2 in the vertical direction, the driving pin 170 may drive only the second movable ring 150 in the vertical direction. When the second movable ring 150 is driven in the vertical direction in the state in which the first movable ring 140 contacts the insulation pillar 130, the distance between the second movable ring 150 and the insulation pillar 130 in the vertical direction may be less than the depth of the first driving groove H2 of the first movable ring 140. For example, the maximum value of the distance between the second movable ring 150 and the insulation pillar 130 in the vertical direction in the state in which the first movable ring 140 contacts the insulation pillar 130 may be equal to the difference between the depth of the first driving groove H2 and the depth of the second driving groove H3.

FIG. 11 is a cross-sectional view illustrating the enlargement of the side A_III of the electrostatic chuck 10_III in the third state. In the third state of the electrostatic chuck 10_III, the driving pin 170 may drive the first movable ring 140 and the second movable ring 150 in the vertical direction.

In a non-limiting example embodiment, when the electrostatic chuck 10_III is in the third state, the first movable ring 140 and the second movable ring 150 may be spaced apart from the insulation pillar 130 in the vertical direction. In more detail, the driving pin 170 may be positioned in the first driving groove H2 of the first movable ring 140 and may contact the first contact unit 143. In addition, the driving pin 170 may be positioned in the second driving groove H3 of the second movable ring 150 and may contact the second contact unit 151.

In a non-limiting example embodiment, when the driving pin 170 moves with a depth greater than that of the first driving groove H2 of the first movable ring 140, the driving pin 170 may drive the first movable ring 140 and the second movable ring 150 in the vertical direction.

Figure 12:
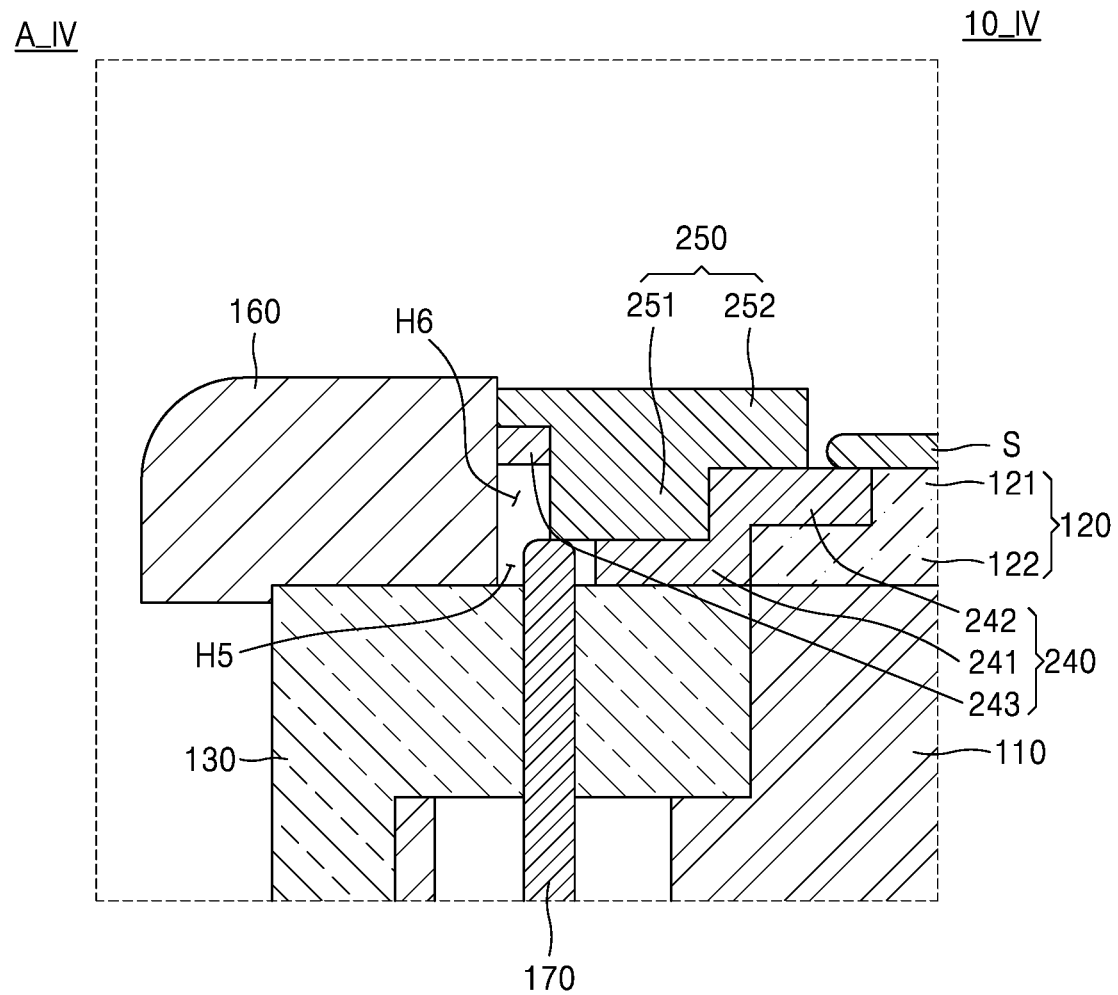
FIG. 12 is a cross-sectional view illustrating enlargement of a side of an electrostatic chuck in a first state.
Figure 13:
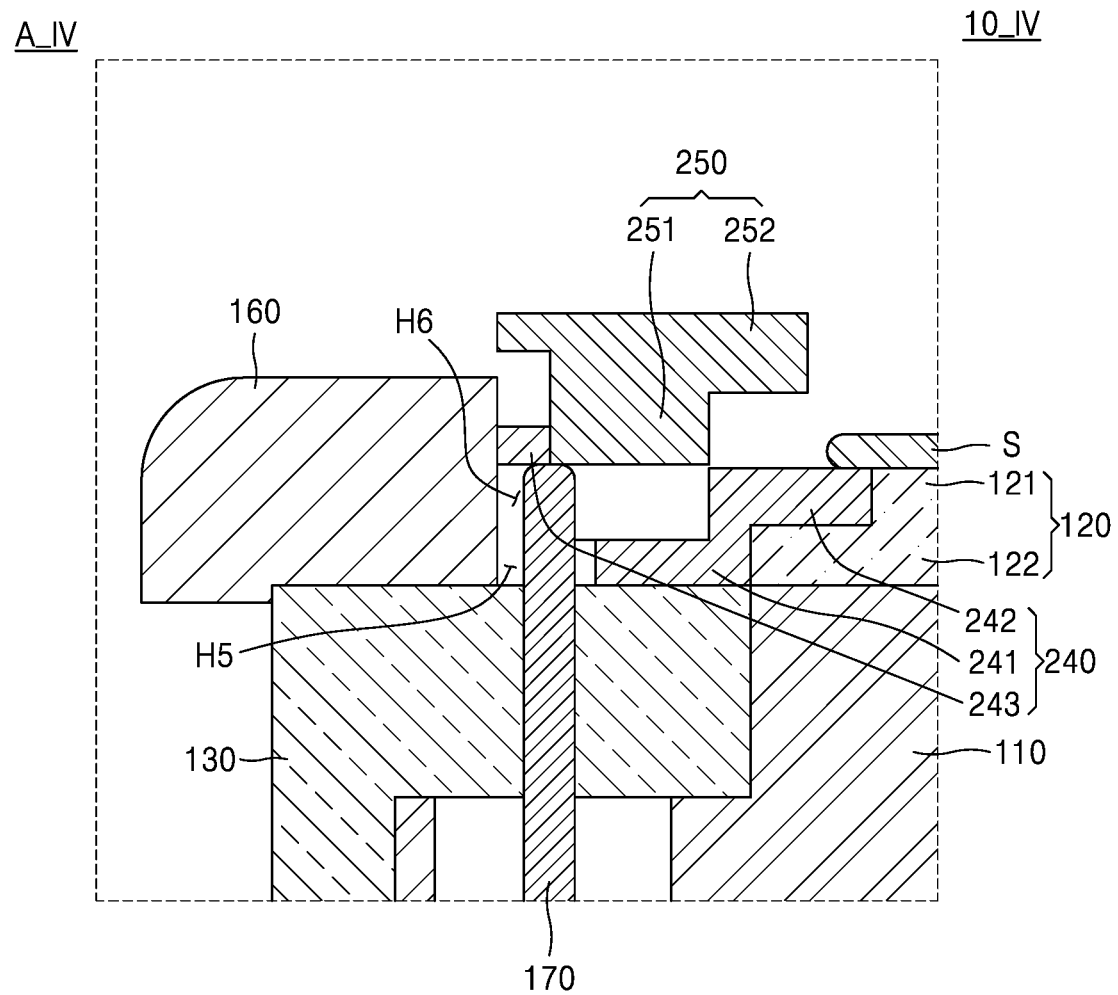
FIG. 13 is a cross-sectional view illustrating enlargement of a side of an electrostatic chuck in a second state.
Figure 14:
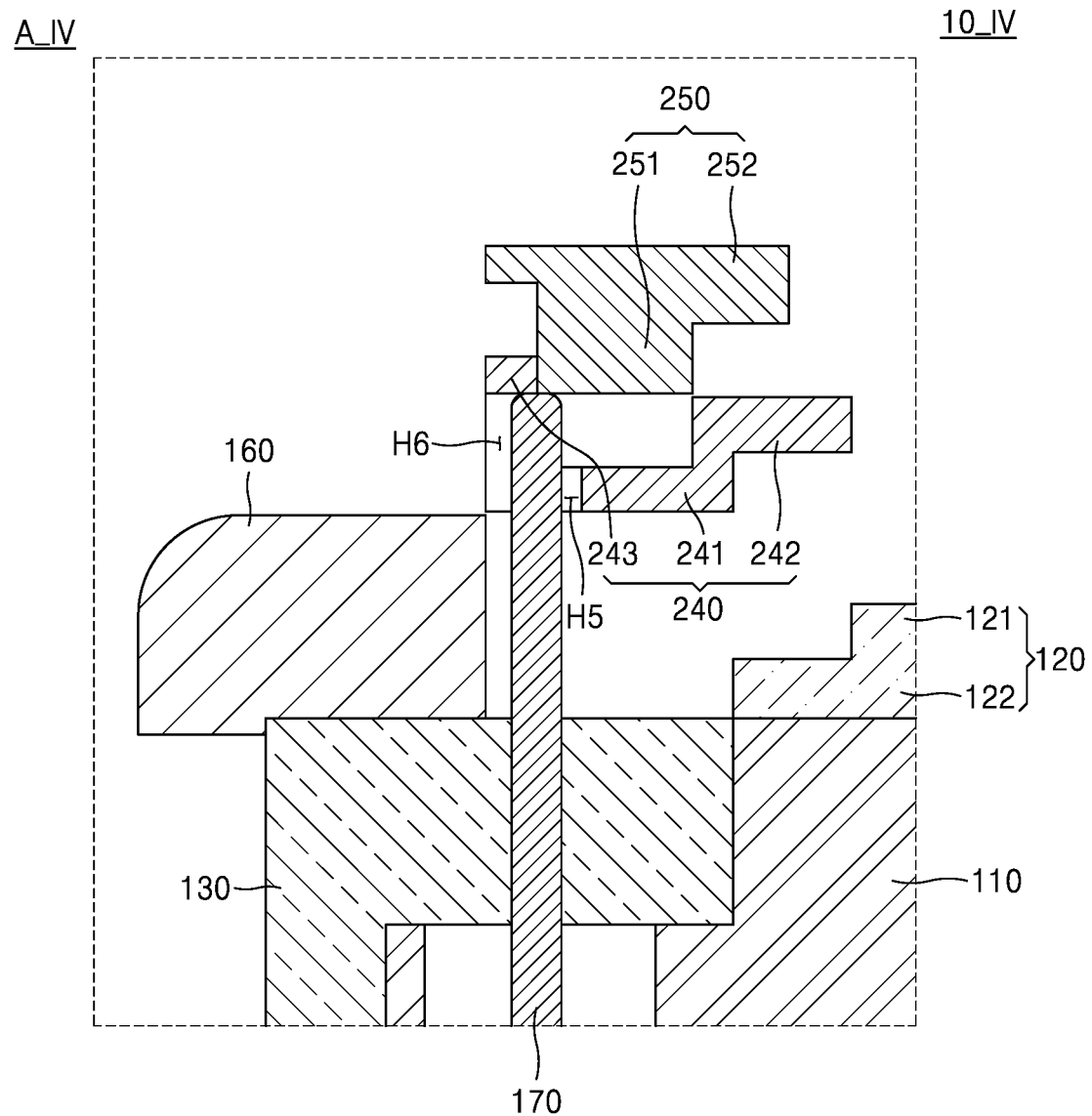
FIG. 14 is a cross-sectional view illustrating enlargement of a side of an electrostatic chuck in a third state.

FIGS. 12 to 14 are cross-sectional views illustrating enlargement of a side A_IV of an electrostatic chuck 10_IV according to an embodiment of the present disclosure. In more detail, FIG. 12 is a cross-sectional view illustrating the enlargement of the side A_IV of the electrostatic chuck 10_IV in the first state.

Referring to FIG. 12, a first movable ring 240 may include a support unit 241, a protection unit 242, and a first contact unit 243. The support unit 241 may be a part of the first movable ring 240 mounted on the insulation pillar 130. In the first state of the electrostatic chuck 10_IV, the support unit 241 may contact the insulation pillar 130.

In the support unit 241, a through hole H5 that may accommodate the driving pin 170 may be formed. An area of the through hole H5 may be greater than that of a cross-section of the driving pin 170. The through hole H5 formed in the support unit 241 may overlap the driving pin 170 in the vertical direction.

In a non-limiting example embodiment, the protection unit 242 may be a part of the first movable ring 240 extending from inside the support unit 241 in the horizontal direction and surrounding the side of the chuck plate 120. In more detail, the protection unit 242 may extend from inside the support unit 241 in the horizontal direction and may surround the side of the first portion 121 of the chuck plate 120 and the upper surface of the second portion 122 of the chuck plate 120. In the first state of the electrostatic chuck 10_IV, the protection unit 242 may contact the side of the chuck plate 120.

In a non-limiting example embodiment, the first contact unit 243 may be a part of the first movable ring 240 extending from outside the support unit 241 in the vertical direction. In the first contact unit 243, a third driving groove H6 connected to the through holes H5 in the vertical direction may be formed. The third driving groove H6 may provide a space in which the driving pin 170 is positioned and may move in the vertical direction. In addition, the third driving groove H6 may overlap at least a part of the driving pin 170 in the vertical direction. When the electrostatic chuck 10_IV is in the first state, the first contact unit 243 may not contact the driving pin 170.

In a non-limiting example embodiment, the second movable ring 250 may be provided on the support unit 241 of the first movable ring 240 so as to overlap at least a part of the through holes H5 in the vertical direction. The second movable ring 250 may include a second contact unit 251 and a cover 252.

In a non-limiting example embodiment, the second contact unit 251 may be positioned on the support unit 241 of the first movable ring 240. In more detail, the second contact unit 251 may be positioned on the support unit 241 so as to be surrounded by the protection unit 242 and the first contact unit 243 of the first movable ring 240.

In a non-limiting example embodiment, the cover 252 extends from the second contact unit 251 in the horizontal direction and may cover a part of an upper portion of the first movable ring 240. In more detail, the cover 252 extends from the second contact unit 251 in the horizontal direction and may cover a part of the protection unit 242 of the first movable ring 240.

When the electrostatic chuck 10_IV is in the first state, the support unit 241 of the first movable ring 240 may contact the insulation pillar 130 and the second contact unit 251 of the second movable ring 250 may contact the support unit 241 of the first movable ring 240.

FIG. 13 is a cross-sectional view illustrating enlargement of a side A_IV of an electrostatic chuck 10_IV in a second state. In the second state of the electrostatic chuck 10_IV, the driving pin 170 may drive the second movable ring 250 in the vertical direction. In more detail, when the electrostatic chuck 10_IV is in the second state, the second movable ring 250 may be spaced apart from the first movable ring 240 in the vertical direction and the first movable ring 240 may contact the insulation pillar 130.

In a non-limiting example embodiment, the driving pin 170 passes through the through hole H5 of the support unit 241 of the first movable ring 240 and may be provided in the third driving groove H6 of the first contact unit 243. When the driving pin 170 passes through the through hole H5 and moves with a depth less than that of the third driving groove H6 in the vertical direction, the driving pin 170 may drive only the second movable ring 250 in the vertical direction.

In a non-limiting example embodiment, in a state in which the first movable ring 240 contacts the insulation pillar 130, when the second movable ring 250 is driven in the vertical direction, a distance between the second movable ring 250 and the support unit 241 of the first movable ring 240 in the vertical direction may be less than the depth of the third driving groove H6.

FIG. 14 is a cross-sectional view illustrating enlargement of the side A_IV of the electrostatic chuck 10_IV in a third state. In the third state of the electrostatic chuck 10_IV, the driving pin 170 may drive the first movable ring 240 and the second movable ring 250 in the vertical direction.

In a non-limiting example embodiment, the driving pin 170 is positioned in the third driving groove H6 through the through hole H5 of the first movable ring 240 and may contact the first contact unit 243. In addition, the driving pin 170 may contact the second contact unit 251. In the third state of the electrostatic chuck 10_IV, a surface of the first contact unit 243 of the first movable ring 240, which contacts the driving pin 170 may be at the same level as that of a surface of the second contact unit 251 of the second movable ring 250, which contacts the driving pin 170.

When the driving pin 170 moves with a depth greater than that of the third driving groove H6 of the first movable ring 240, the driving pin 170 may drive the first movable ring 240 and the second movable ring 250 in the vertical direction.

Figure 15:
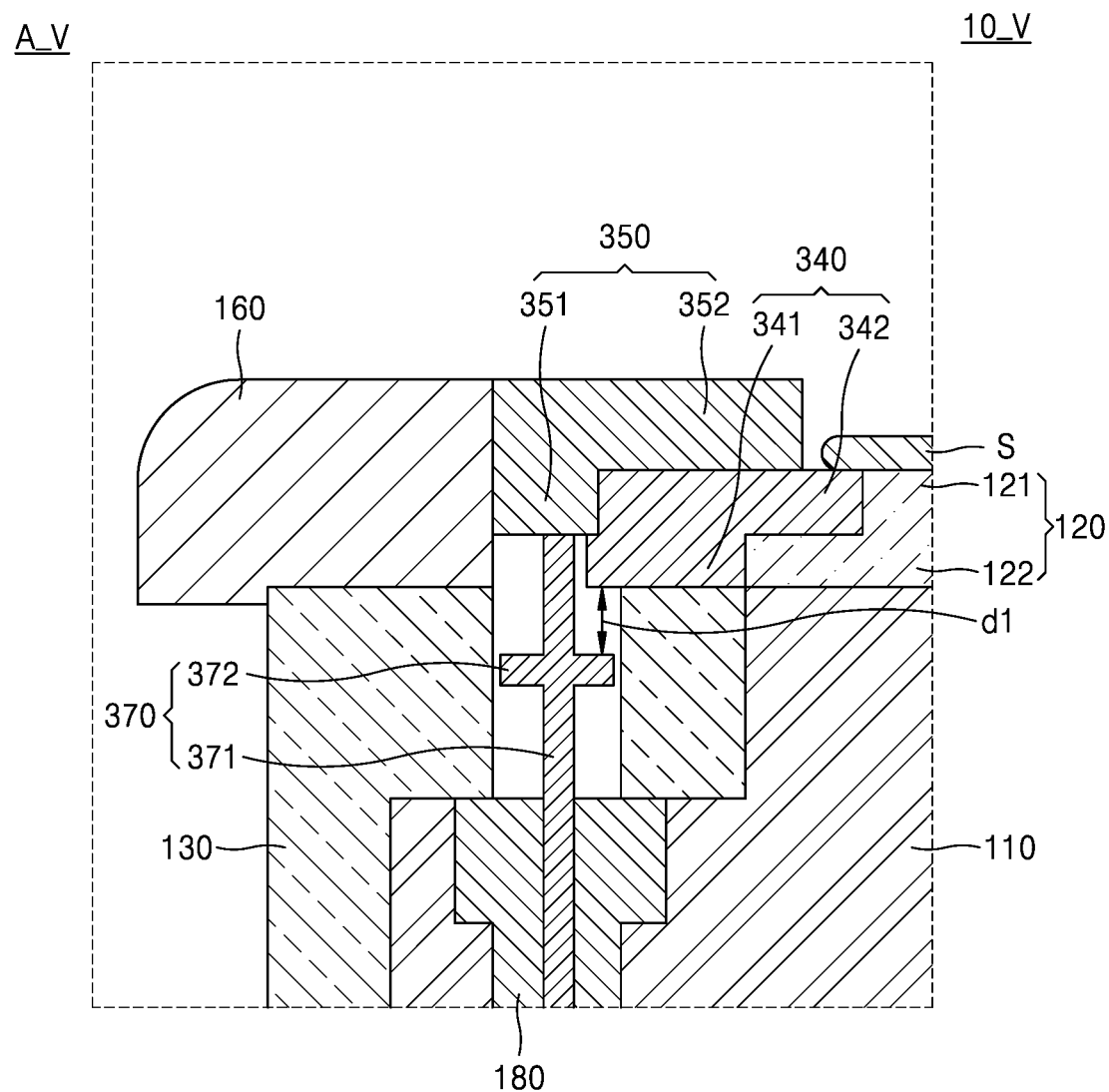
FIG. 15 is a cross-sectional view illustrating enlargement of a side of an electrostatic chuck in a first state.
Figure 16:
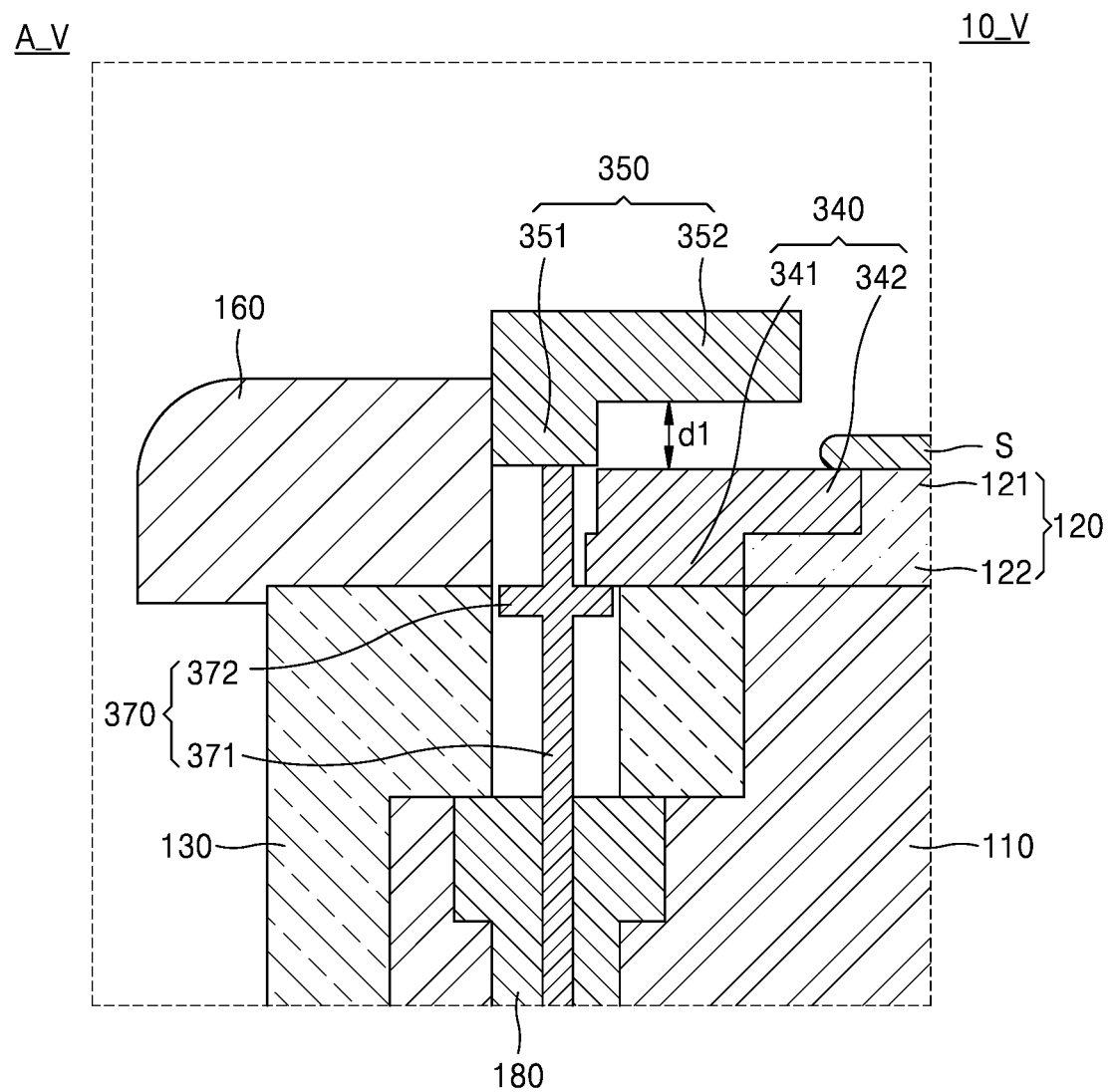
FIG. 16 is a cross-sectional view illustrating enlargement of a side of an electrostatic chuck in a second state.
Figure 17:
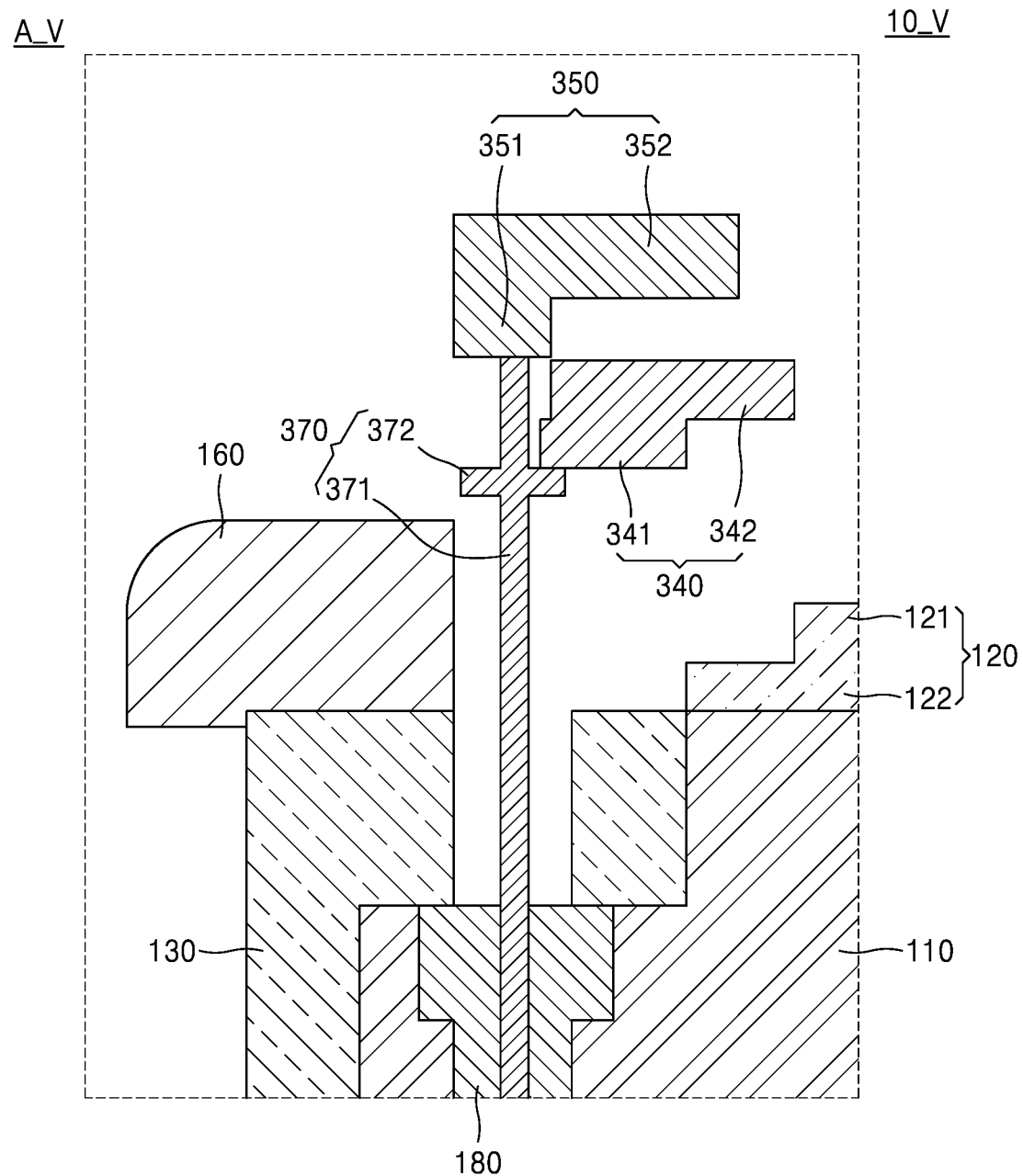
FIG. 17 is a cross-sectional view illustrating enlargement of a side of an electrostatic chuck in a third state.

FIGS. 15 to 17 are cross-sectional views illustrating enlargement of a side A_V of an electrostatic chuck 10_V according to an embodiment of the present disclosure. In more detail, FIG. 15 is a cross-sectional view illustrating the enlargement of the side A_V of the electrostatic chuck 10_V in the first state. In the first state of the electrostatic chuck 10_V, the driving pin 170 may not operate. That is, in the first state of the electrostatic chuck 10_V, a first movable ring 340 and a second movable ring 350 may not be driven in the vertical direction.

Referring to FIG. 15, the first movable ring 340 may include a first contact unit 341 and a protection unit 342. In an embodiment, the first contact unit 341 may be a part of the first movable ring 340 mounted on the insulation pillar 130. The first contact unit 341 may overlap a pin protrusion 372 of a driving pin 370 to be described later in the vertical direction. When the electrostatic chuck 10_V is in the first state, first contact unit 341 is spaced apart from the pin protrusion 372 in the vertical direction and may contact the insulation pillar 130.

In a non-limiting example embodiment, the protection unit 342 may be a part of the first movable ring 340 extending from inside the first contact unit 341 in the horizontal direction and surrounding the side of the chuck plate 120. In more detail, the protection unit 342 may extend from inside the first contact unit 341 in the horizontal direction and may surround the side of the first portion 121 of the chuck plate 120 and the upper surface of the second portion 122 of the chuck plate 120. In the first state of the electrostatic chuck 10_V, the protection unit 342 may contact the side of the chuck plate 120.

The second movable ring 350 may include a second contact unit 351 and a cover 352. In a non-limiting example embodiment, the second contact unit 351 may be provided on at least a part of the first movable ring 340. In more detail, the second contact unit 351 may be provided on at least a part of the first contact unit 341 of the first movable ring 340. In addition, the second contact unit 351 may contact a pin shaft 371 of a driving pin 370 to be described later in the vertical direction.

In a non-limiting example embodiment, the cover 352 may be a part of the second movable ring 350 extending from the second contact unit 351 in the horizontal direction and covering a part of an upper portion of the first movable ring 340. In more detail, the cover 352 may extend from an upper portion of the second contact unit 351 in the horizontal direction and may cover a part of the protection unit 342 of the first movable ring 340.

In a non-limiting example embodiment, the driving pin 370 may be positioned in the pin hole H1 of the insulation pillar 130 and may drive the first movable ring 340 and the second movable ring 350 in the vertical direction. In addition, the driving pin 370 may include the pin shaft 371 and the pin protrusion 372.

In a non-limiting example embodiment, the pin shaft 371 may be a rod positioned in the pin hole H1 of the insulation pillar 130 and extending in the vertical direction. In addition, the pin shaft 371 may be overlapped by a part of the second movable ring 350 in the vertical direction.

In a non-limiting example embodiment, the pin protrusion 372 may extend from the pin shaft 371 in the horizontal direction. For example, the pin protrusion 372 may be a ring surrounding the pin shaft 371. In addition, the pin protrusion 372 may be overlapped by a part of the first movable ring 340 in the vertical direction. When the electrostatic chuck 10_V is in the first state, the pin protrusion 372 may be spaced apart from the first movable ring 340 by a first distance d1 in the vertical direction. As described later, when the pin protrusion 372 contacts the first movable ring 340, the second movable ring 350 may be spaced apart from the first movable ring 340 by the first distance d1.

FIG. 16 is a cross-sectional view illustrating the enlargement of the side A_V of the electrostatic chuck 10_V in the second state. In the second state of the electrostatic chuck 10_V, the driving pin 370 may drive the second movable ring 350 in the vertical direction. When the electrostatic chuck 10_V is in the second state, the substrate S may be mounted on the chuck plate 120.

In a non-limiting example embodiment, the pin shaft 371 of the driving pin 370 may contact the second contact unit 351 of the second movable ring 350 and may apply external force to the second movable ring 350 in the vertical direction. In addition, the pin protrusion 372 of the driving pin 370 may not contact the first contact unit 341 of the first movable ring 340. Embodiments of the present disclosure are not limited thereto. The pin protrusion 372 may contact the first contact unit 341 of the first movable ring 340 and may not apply external force to the first movable ring 340 in the vertical direction.

In a non-limiting example embodiment, when the pin shaft 371 moves upward in a state in which the pin protrusion 372 does not contact the first contact unit 341 of the first movable ring 340 (that is, in a state in which the first movable ring 340 contacts the insulation pillar 130), the driving pin 370 may drive the second movable ring 350 in the vertical direction. When the electrostatic chuck 10_V is in the second state, the first movable ring 340 is not driven in the vertical direction and may contact the insulation pillar 130. In addition, the second movable ring 350 may be spaced apart from the first movable ring 340 in the vertical direction.

In a non-limiting example embodiment, as described above, when the electrostatic chuck 10_V is in the first state, the pin protrusion 372 may be spaced apart from the first movable ring 340 by the first distance d1 in the vertical direction. When the second movable ring 350 is driven in the vertical direction in the state in which the first movable ring 340 contacts the insulation pillar 130, a distance between the second movable ring 350 and the first movable ring 340 in the vertical direction may have a value of no more than the first distance d1. For example, in the state in which the first movable ring 340 contacts the insulation pillar 130, the maximum value of the distance between the second movable ring 350 and the first movable ring 340 in the vertical direction may be equal to the first distance d1.

FIG. 17 is a cross-sectional view illustrating enlargement of the side A_V of the electrostatic chuck 10_V in the third state. In the third state of the electrostatic chuck 10_V, the driving pin 370 may drive the first movable ring 340 and the second movable ring 350 in the vertical direction. When the electrostatic chuck 10_V is in the third state, the substrate S may not be mounted on the chuck plate 120.

In a non-limiting example embodiment, when the electrostatic chuck 10_V is in the third state, the driving pin 370 may drive the first movable ring 340 and the second movable ring 350 in the vertical direction. In more detail, when the electrostatic chuck 10_V is in the third state, the first movable ring 340 may be spaced apart from the insulation pillar 130 in the vertical direction and the second movable ring 350 may be spaced apart from the first movable ring 340 in the vertical direction.

In a non-limiting example embodiment, the pin shaft 371 of the driving pin 370 may contact the second contact unit 351 of the second movable ring 350 and the pin protrusion 372 of the driving pin 370 may contact the first contact unit 341 of the first movable ring 340. When the pin shaft 371 moves upward in the state in which the pin protrusion 372 contacts the first contact unit 341 of the first movable ring 340, the driving pin 370 may drive the first movable ring 340 and the second movable ring 350 in the vertical direction.

In a non-limiting example embodiment, when the electrostatic chuck 10_V is in the third state, a surface of the first contact unit 341 of the first movable ring 340, which contacts the pin protrusion 372 may be at a level lower than that of a surface of the second contact unit 351 of the second movable ring 350, which contacts the pin shaft 371.

Figure 18:
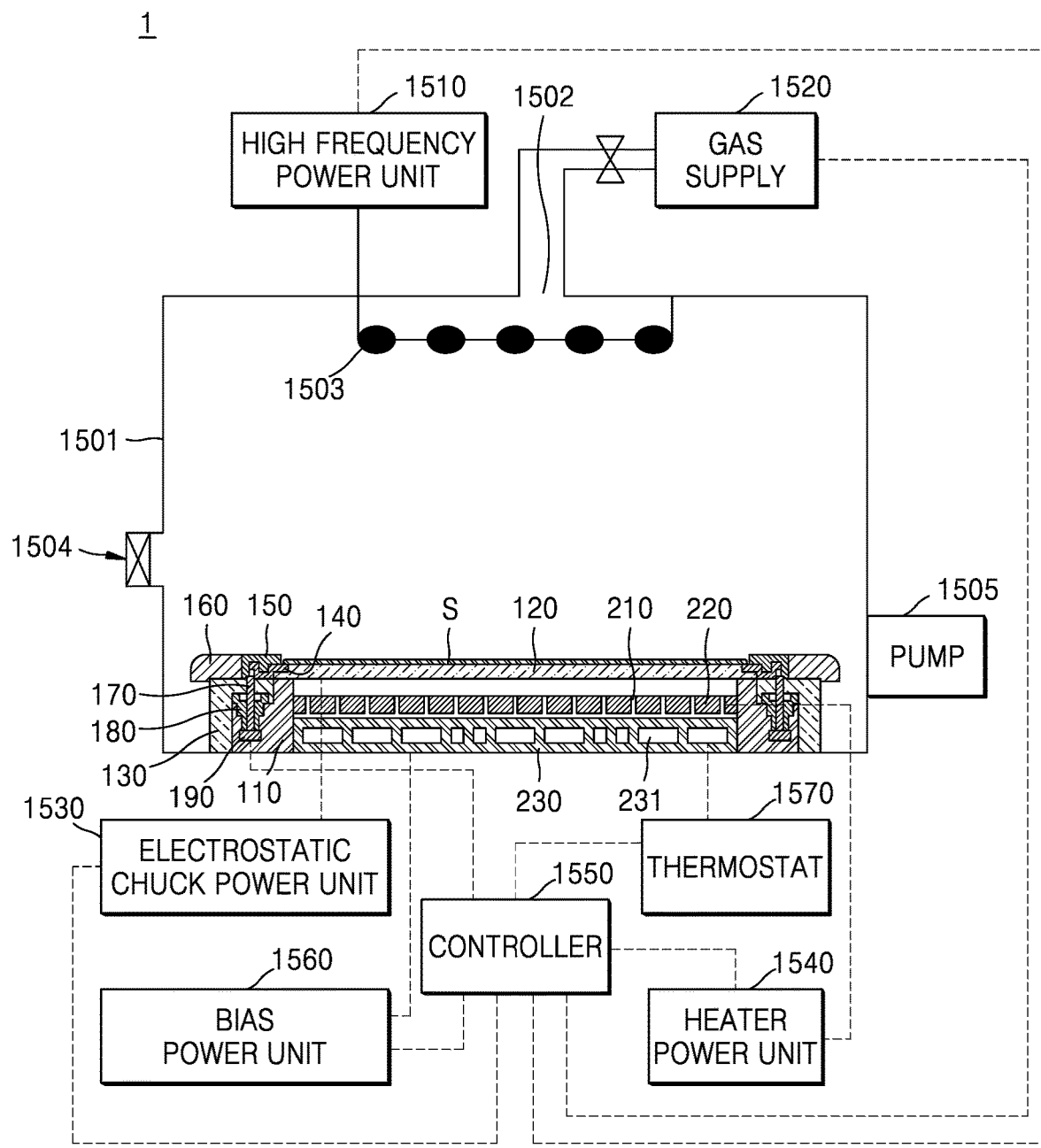
FIG. 18 is a cross-sectional view of a substrate processing apparatus according to an embodiment of the present disclosure.

FIG. 18 is a cross-sectional view of a substrate processing apparatus 1 according to a non-limiting example embodiment of the present disclosure. The substrate processing apparatus 1 according to the embodiment may include at least one of the above-described electrostatic chucks 10_I to 10_V.

Referring to FIG. 18, the substrate processing apparatus 1 may include the electrostatic chuck 10, a process chamber 1501, a gas supply pipe 1502, a plasma generating unit 1503, a gate 1504, a pump 1505, a high frequency power unit 1510, a gas supply 1520, an electrostatic chuck power unit 1530, a heater power unit 1540, a controller 1550, a bias power unit 1560, and the thermostat 1570.

In a non-limiting example embodiment, the electrostatic chuck 10 of the substrate processing apparatus 1 may fix the substrate S by electrostatic force. Since the electrostatic chuck 10 may be the same as described with reference to FIGS. 2 to 17, detailed description thereof is omitted.

In a non-limiting example embodiment, the process chamber 1501 may provide an internal space for processing the substrate S. The electrostatic chuck 10 may be positioned in the internal space of the process chamber 1501. The gas supply pipe 1502 may be connected to the gas supply 1520. The gas supply pipe 1502 may inject a treatment gas provided by the gas supply 1520 into the inside of the process chamber 1501. The treatment gas may include an etching gas for etching the substrate S. In addition, the treatment gas may include a protective gas for protecting patterns formed on the substrate S.

In a non-limiting example embodiment, the gate 1504 may provide a path through which the substrate S may move. For example, the substrate S may move to the outside of the process chamber 1501 through the gate 1504 and may move to the inside of the process chamber 1501 through the gate 1504. The pump 1505 may control internal pressure of the process chamber 1501. For example, the pump 1505 may increase pressure by injecting air into the inside of the process chamber 1501. In addition, the pump 1505 may reduce pressure by discharging air in the process chamber 1501.

In a non-limiting example embodiment, the high frequency power unit 1510 may be electrically connected to the plasma generating unit 1503. The high frequency power unit 1510 may output high frequency power suitable for generating plasma and may transmit the output high frequency power to the plasma generating unit 1503. The high frequency power of the high frequency power unit 1510 may be controlled by the controller 1550.

In a non-limiting example embodiment, the electrostatic chuck power unit 1530 may be electrically connected to the electrostatic chuck 10. In more detail, the electrostatic chuck power unit 1530 may be electrically connected to the electrostatic plate 210 of the electrostatic chuck 10. By power, for example, the DC voltage applied by the electrostatic chuck power unit 1530, electrostatic force may be generated between the electrostatic plate 210 and the substrate S. The substrate S may be firmly mounted on the chuck plate 120 of the electrostatic chuck 10 by electrostatic force.

In a non-limiting example embodiment, the heater power unit 1540 may be electrically connected to the heating plate 220. The heater power unit 1540 may be connected to the controller 1550 and a calorific value of a plurality of heating elements included in the heating plate 220 may be controlled.

In a non-limiting example embodiment, the bias power unit 1560 may be connected to a lower portion of the body 110. The bias power unit 1560 may apply high frequency power to the lower portion of the body 110. The lower portion of the body 110 may function as an electrode for generating plasma.

In a non-limiting example embodiment, the thermostat 1570 may be connected to the cooling water channel 231 of the cooling plate 230 and the controller 1550. The thermostat 1570 may control the temperature of cooling water that flows through the cooling water channel 231.

In a non-limiting example embodiment, the controller 1550 may control at least one of the high frequency power unit 1510, the gas supply 1520, the electrostatic chuck power unit 1530, the heater power unit 1540, the bias power unit 1560, and the thermostat 1570.

In a non-limiting example embodiment, the controller 1550 may control the power source 190 of the electrostatic chuck 10. The power source 190 is controlled by the controller 1550 and may drive the first movable ring 140 and the second movable ring 150. The electrostatic chuck 10 according to the embodiment may be in at least one of the above-described first, second, and third states by the power source 190 controlled by the controller 1550.

The controller 1550 may comprise at least one processor and memory. The memory may comprise computer instructions that, when executed by the at least one processor, cause the controller 1550 to perform its functions.

While non-limiting example embodiments of the present disclosure has been particularly shown and described, it will be understood that various changes in form and details may be made therein without departing from the spirit and scope of the following claims.

What is claimed is:

1. An electrostatic chuck comprising:
a chuck plate configured to mount a substrate;
an insulation pillar provided outside the chuck plate, the insulation pillar having a pin hole formed therein;
a first movable ring provided on the insulation pillar, surrounding a side of the chuck plate;
a second movable ring configured to cover at least a part of an upper portion of the first movable ring; and
a driving pin configured to move in the pin hole of the insulation pillar in a vertical direction, the driving pin overlapped by at least a part of the first movable ring and at least a part of the second movable ring in the vertical direction,
wherein the driving pin is configured to drive the first movable ring and the second movable ring in the vertical direction or to drive the second movable ring in the vertical direction, and
wherein, in a state in which the driving pin drives the first movable ring and the second movable ring in the vertical direction, a surface of the first movable ring contacting the driving pin and a surface of the second movable ring contacting the driving pin are at a same level.

2. The electrostatic chuck of claim 1, wherein the chuck plate comprises:
a first portion in which the substrate is mounted; and
a second portion extending from a lower portion of the first portion to outside the first portion,
wherein the first movable ring comprises:
a support unit mounted on the insulation pillar;
a protection unit extending from inside the support unit in a horizontal direction and surrounding a side of the first portion of the chuck plate and an upper surface of the second portion of the chuck plate; and
a first contact unit extending from outside the support unit in the horizontal direction and having a first driving groove in which the driving pin may be positioned.

3. The electrostatic chuck of claim 2, wherein the first driving groove of the first contact unit overlaps at least a part of the driving pin in the vertical direction, and
wherein, when the driving pin moves with a depth greater than that of the first driving groove in the vertical direction, the driving pin drives the first movable ring and the second movable ring in the vertical direction.

4. The electrostatic chuck of claim 1, wherein
the chuck plate comprises:
a first portion in which the substrate is mounted; and
a second portion extending from a lower portion of the first portion to outside the first portion,
wherein the first movable ring comprises:
a support unit mounted on the insulation pillar and having a through hole through which the driving pin passes;
a protection unit extending from inside the support unit in a horizontal direction and surrounding a side of the first portion of the chuck plate and an upper surface of the second portion of the chuck plate; and
a first contact unit extending from outside the support unit in the vertical direction and having a first driving groove connected to the through hole in the vertical direction so that the driving pin is positioned within the first driving groove, and
wherein the second movable ring is provided on the support unit of the first movable ring so as to overlap at least a part of the through hole in the vertical direction.

5. The electrostatic chuck of claim 4, wherein the second movable ring comprises:
a second contact unit positioned on the support unit of the first movable ring so as to overlap at least a part of the driving pin in the vertical direction; and
a cover extending from the second contact unit in the horizontal direction and covering the part of the upper portion of the first movable ring,
wherein, when the driving pin moves with a depth less than a depth of the first driving groove in the vertical direction, the driving pin drives the second movable ring in the vertical direction without driving the first movable ring in the vertical direction, and
wherein, when the driving pin moves with a depth greater than the depth of the first driving groove in the vertical direction, the driving pin drives the first movable ring and the second movable ring in the vertical direction.

6. The electrostatic chuck of claim 1, further comprising:
a guide holder configured to guide movement of the driving pin in the vertical direction; and
a power source configured to transmit power to the driving pin.

7. The electrostatic chuck of claim 1, further comprising a fixed ring provided on the insulation pillar so as to surround the first movable ring and the second movable ring, wherein the fixed ring does not overlap the driving pin in the vertical direction.

8. A substrate processing apparatus comprising:
a process chamber configured to regulate an internal space for processing a substrate;
a gas supply connected to the process chamber and configured to supply a treatment gas for processing the substrate in the internal space; and
an electrostatic chuck configured to support the substrate in the internal space,
wherein the electrostatic chuck comprises:
- a chuck plate configured to mount the substrate;
- an insulation pillar provided outside the chuck plate, the insulation pillar having a pin hole formed therein;
- a first movable ring provided on the insulation pillar, surrounding a side of the chuck plate;
- a second movable ring covering at least a part of an upper portion of the first movable ring; and
- a driving pin configured to move in the pin hole of the insulation pillar in a vertical direction, the driving pin overlapped by at least a part of the first movable ring and at least a part of the second movable ring in the vertical direction, and configured to drive the first movable ring and the second movable ring in the vertical direction or to drive the second movable ring in the vertical direction, and wherein, in a state in which the driving pin drives the first movable ring and the second movable ring in the vertical direction, a surface of the first movable ring contacting the driving pin and a surface of the second movable ring contacting the driving pin are at a same level.

9. The substrate processing apparatus of claim 8, wherein the first movable ring comprises:
- a support unit mounted on the insulation pillar;
- a protection unit extending from inside of the support unit in a horizontal direction and surrounding the side of the chuck plate; and
- a first contact unit extending from outside the support unit in the horizontal direction and having a first driving groove in which the driving pin is positioned, and wherein the second movable ring comprises:
- a second contact unit provided on the insulation pillar, surrounding the first movable ring, and having a second driving groove in which the driving pin is positioned; and
- a cover extending from the second contact unit in the horizontal direction and covering at least the part of the upper portion of the first movable ring.

10. The substrate processing apparatus of claim 9, wherein the driving pin is overlapped by at least a part of the first contact unit and at least a part of the second contact unit in the vertical direction, and
wherein a depth of the first driving groove is greater than a depth of the second driving groove.

11. The substrate processing apparatus of claim 8, further comprising:
- a guide holder configured to guide movement of the driving pin in the vertical direction;
- a power source configured to transmit power to the driving pin; and
- a fixed ring provided on the insulation pillar so as to surround the first movable ring and the second movable ring, wherein the fixed ring does not overlap the driving pin in the vertical direction.

* * * * *